United States Patent
Lee et al.

(10) Patent No.: US 10,069,041 B2
(45) Date of Patent: Sep. 4, 2018

(54) DISPLAY APPARATUS AND MANUFACTURING METHOD THEREOF

(71) Applicant: Innolux Corporation, Miao-Li County (TW)

(72) Inventors: Kuan-Feng Lee, Miao-Li County (TW); Ting-Kai Hung, Miao-Li County (TW); Yu-Hsien Wu, Miao-Li County (TW); Chia-Hsiung Chang, Miao-Li County (TW)

(73) Assignee: Innolux Corporation, Miao-Li County (TW)

( * ) Notice: Subject to any disclaimer, the term of this patent is extended or adjusted under 35 U.S.C. 154(b) by 0 days.

(21) Appl. No.: 15/635,220

(22) Filed: Jun. 28, 2017

(65) Prior Publication Data

US 2018/0040774 A1    Feb. 8, 2018

Related U.S. Application Data

(60) Provisional application No. 62/371,246, filed on Aug. 5, 2016, provisional application No. 62/376,925, filed (Continued)

(30) Foreign Application Priority Data

Mar. 17, 2017    (CN) .......................... 2017 1 0159698

(51) Int. Cl.
*H01L 29/06*    (2006.01)
*H01L 33/46*    (2010.01)
(Continued)

(52) U.S. Cl.
CPC ............ *H01L 33/46* (2013.01); *H01L 27/156* (2013.01); *H01L 33/007* (2013.01); *H01L 33/06* (2013.01);
(Continued)

(58) Field of Classification Search
CPC ... H01L 33/46; H01L 33/007; H01L 33/0095; H01L 33/06; H01L 33/22; H01L 33/32;
(Continued)

(56) References Cited

U.S. PATENT DOCUMENTS 9,065,033 B2 *    6/2015    Lee .................... H01L 33/502

* cited by examiner

*Primary Examiner* — Tu-Tu Ho
(74) *Attorney, Agent, or Firm* — JCIPRNET

(57) ABSTRACT

A display apparatus is provided. The display apparatus includes a substrate, a transistor, a metal layer, and a light-emitting diode. The transistor is disposed on the substrate. The metal layer is disposed on the transistor and electrically connected to the transistor, wherein a first distance is between the upper surface of the metal layer and the substrate in a direction perpendicular to the substrate. The light-emitting diode is disposed on the metal layer, wherein the light-emitting diode includes a light-emitting diode body and an electrode, the light-emitting diode body is electrically connected to the metal layer via the electrode, the light-emitting diode body has a first surface and a second surface opposite to the first surface, the first surface and the second surface are parallel to the substrate, and in the direction above, a second distance is between the first surface and the second surface, wherein the ratio of the second distance to the first distance is greater than or equal to 0.25 and less than or equal to 6.

8 Claims, 28 Drawing Sheets

Related U.S. Application Data on Aug. 19, 2016, provisional application No. 62/394,225, filed on Sep. 14, 2016, provisional application No. 62/429,162, filed on Dec. 2, 2016.

(51) Int. Cl.
*H01L 27/15* (2006.01)
*H01L 33/62* (2010.01)
*H01L 33/22* (2010.01)
*H01L 33/06* (2010.01)
*H01L 33/32* (2010.01)
*H01L 33/00* (2010.01)

(52) U.S. Cl.
CPC ............. *H01L 33/22* (2013.01); *H01L 33/32* (2013.01); *H01L 33/62* (2013.01); *H01L 2933/0025* (2013.01)

(58) Field of Classification Search
CPC ............................. H01L 33/62; H01L 27/156; H01L 2933/0025
USPC .......................................................... 257/13
See application file for complete search history.

DISPLAY APPARATUS AND MANUFACTURING METHOD THEREOF

CROSS-REFERENCE TO RELATED APPLICATION

This application claims the priority benefits of U.S. provisional application Ser. No. 62/371,246, filed on Aug. 5, 2016, U.S. provisional application Ser. No. 62/376,925, filed on Aug. 19, 2016, U.S. provisional application Ser. No. 62/394,225, filed on Sep. 14, 2016, U.S. provisional application Ser. No. 62/429,162, filed on Dec. 2, 2016, and China application serial no. 201710159698.5, filed on Mar. 17, 2017. The entirety of each of the above-mentioned patent applications is hereby incorporated by reference herein and made a part of this specification.

BACKGROUND OF THE INVENTION

Field of the Invention

The disclosure relates to an apparatus and a manufacturing method thereof, and more particularly, to a display apparatus and a manufacturing method thereof.

Description of Related Art

Since a light-emitting diode (LED) display apparatus has advantages such as active light emission, high brightness, high contrast, and low power consumption, the LED display apparatus has become one of the techniques of rigorous development for new displays in recent years. To meet high resolution requirements, the LED display apparatus is being developed to include an active device array substrate and micron-sized LEDs arranged in an array.

SUMMARY OF THE INVENTION

The disclosure provides a display apparatus that can have good luminous efficiency or good structural strength.

The disclosure provides a manufacturing method of a display apparatus that can manufacture a display apparatus having good luminous efficiency.

A display apparatus of the disclosure includes a substrate, a transistor, a metal layer, and a light-emitting diode. The transistor is disposed on the substrate. The metal layer is disposed on the transistor and electrically connected to the transistor, wherein a first distance is between the upper surface of the metal layer and the substrate in a direction perpendicular to the substrate. The light-emitting diode is disposed on the metal layer, wherein the light-emitting diode includes a light-emitting diode body and an electrode, the light-emitting diode body is electrically connected to the metal layer via the electrode, the light-emitting diode body has a first surface and a second surface opposite to the first surface, the first surface and the second surface are parallel to the substrate, and in the direction above, a second distance is between the first surface and the second surface, wherein the ratio of the second distance to the first distance is greater than or equal to 0.25 and less than or equal to 6.

The manufacturing method of the display apparatus of the disclosure includes the following steps. A light-emitting diode body is formed on a substrate. A reflective structure is formed on the sidewall of the light-emitting diode body.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
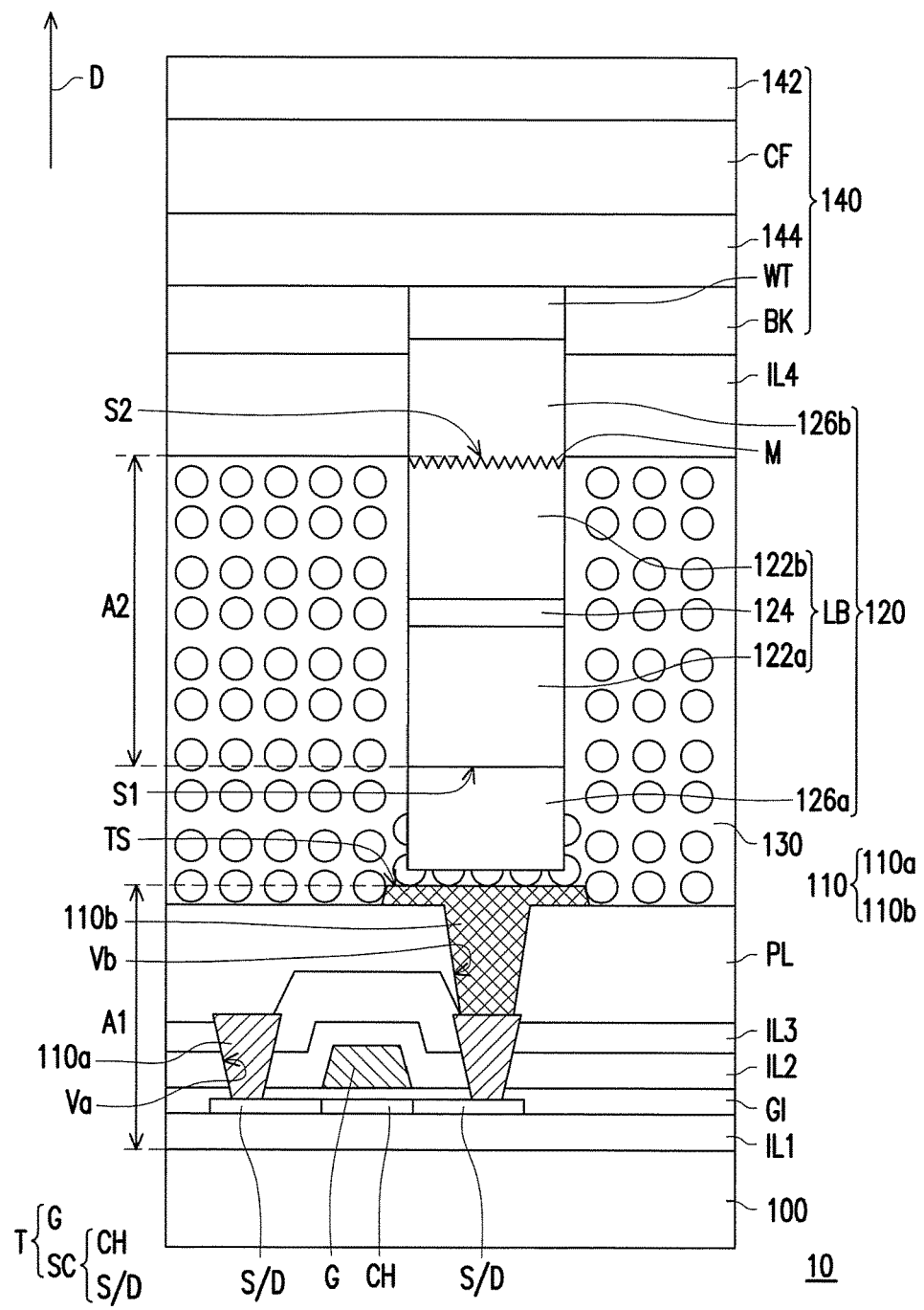
FIG. 1 is a cross-sectional schematic diagram of a display apparatus of an embodiment of the disclosure.

In the present specification, wherever possible, the same reference numerals are used in the drawings and the descriptions to refer to the same or similar portions.

In the present specification, descriptions of forming another structure above a structure or on a structure can include embodiments in which the structure and the other structure are in direct contact, and can also include embodiments in which an additional structure can be formed between the structure and the other structure such that the structure and the other structure are not in direct contact.

In the following, various embodiments are provided to describe the display apparatus of the disclosure in detail as examples of actual implementation of the disclosure and are not intended to limit the disclosure.

FIG. 1 is a cross-sectional schematic diagram of a display apparatus of an embodiment of the disclosure. For ease of explanation, FIG. 1 only shows one pixel unit. However, any person having ordinary skill in the art should understand that, a display apparatus generally includes a plurality of pixel units arranged in an array.

Referring to FIG. 1, in the present embodiment, a display apparatus 10 includes a substrate 100, a transistor T, a metal layer 110, and a light-emitting diode 120. Moreover, in the present embodiment, the display apparatus can further include an insulating layer IL1, a gate insulating layer GI, an insulating layer IL2, an insulating layer IL3, a flat layer PL, a conductive adhesive layer 130, an insulating layer IL4, and an opposite substrate 140.

The material of the substrate 100 can be, for instance, glass, quartz, organic polymer, or metal material, wherein the organic polymer is, for instance (but not limited to): polyimide (PI), polyethylene terephthalate (PET), or polycarbonate (PC).

The transistor T is disposed on the substrate 10. In the present embodiment, the transistor T includes a semiconductor layer SC and a gate G located above the semiconductor layer SC. Specifically, the semiconductor layer SC includes a channel region CH and source/drain regions S/D, wherein the gate G is located above the channel region CH, and the source/drain regions S/D are located at two sides of the channel region CH. In the present embodiment, the material of the semiconductor layer SC is low-temperature polysilicon, that is, the transistor T is a low-temperature polysilicon thin film transistor. Moreover, out of consideration for conductivity, the material of the gate G is generally a metal material such as aluminum, molybdenum, titanium, gold, indium, tin, or a combination thereof. However, the disclosure is not limited thereto, and in other embodiments, the material of the gate G can also include, for instance (but not limited to): other conductive materials such as alloy, nitride of metal materials, oxide of metal materials, or oxynitride of metal materials, or stacked layers of metal materials and the other conductive materials above.

Moreover, a gate insulating layer GI is disposed between the gate G and the semiconductor layer SC, wherein the gate insulating layer GI is conformally formed on the substrate 100 and covers the semiconductor layer SC. The material of the gate insulating layer GI can be, for instance (but not limited to): inorganic material, organic material, or a combination thereof, wherein the inorganic material is, for instance (but not limited to): silicon oxide, silicon nitride, silicon oxynitride, or stacked layers of at least two of the materials above; and the organic material is, for instance (but not limited to): a polymer material such as polyimide resin, epoxy resin, or acrylic resin.

Moreover, an insulating layer IL1 is disposed between the substrate 100 and the semiconductor layer SC, wherein the insulating layer IL1 is conformally formed on the substrate 100. The material of the insulating layer IL1 can be, for instance (but not limited to): silicon oxide, silicon nitride, silicon oxynitride, or stacked layers of at least two of the materials above.

Moreover, insulating layers IL2 and IL3 further cover the gate G to protect the gate G. The insulating layer IL3 is located on the insulating layer IL2, and the insulating layers IL2 and IL3 are respectively conformally formed on the substrate 100. Moreover, the material of the insulating layers IL2 and IL3 can be (but not limited to): inorganic material, organic material, or a combination thereof, wherein the inorganic material is, for instance (but not limited to): silicon oxide, silicon nitride, silicon oxynitride, or stacked layers of at least two of the materials above; and the organic material is, for instance (but not limited to): a polymer material such as polyimide resin, epoxy resin, or acrylic resin.

The metal layer 110 is disposed on the transistor T and electrically connected to the transistor T. Specifically, in the present embodiment, the metal layer 110 includes a first metal layer 110a and a second metal layer 110b located above the first metal layer 110a. In other words, in the present embodiment, the metal layer 110 includes two film layers stacked upon each other. However, the disclosure is not limited thereto. In other embodiments, the metal layer 110 can also only include a single film layer. For instance, the metal layer 110 can only include the first metal layer 110a used as the source/drain electrode and not include the second metal layer 110b.

Moreover, in the present embodiment, a distance A1 is between the upper surface TS of the metal layer 110 and the substrate 100 in a direction D perpendicular to the substrate 100. In an embodiment, the distance A1 can be greater than or equal to 2 μm and less than or equal to 8 μm. In another embodiment, the distance A1 can be greater than or equal to 2 μm and less than or equal to 5 μm. In another embodiment, the distance A1 can be greater than or equal to 3 μm and less than or equal to 8 μm. In another embodiment, the distance A1 can be greater than or equal to 4 μm and less than or equal to 8 μm. It should be mentioned that, since the metal layer 110 includes the first metal layer 110a and the second metal layer 110b, the upper surface TS is the top surface of the second metal layer 110b. Moreover, as described above, since the metal layer 110 can also only include the first metal layer 110a, at this point, the upper surface TS is the top surface of the first metal layer 110a.

The first metal layer 110a is formed in a contact hole Va in the gate insulating layer GI, the insulating layer IL2, and the insulating layer IL3 to be electrically connected to the source/drain regions S/D. In other words, in the present embodiment, the first metal layer 110a is used as the source/drain electrode. Moreover, the material of the first metal layer 110a includes (but is not limited to): aluminum, molybdenum, titanium, gold, indium, tin, or a combination thereof.

Moreover, the flat layer PL further covers the first metal layer 110a to increase flatness. The material of the flat layer PL can be (but is not limited to): inorganic material, organic material, or a combination thereof, wherein the inorganic material is, for instance (but not limited to): silicon oxide, silicon nitride, silicon oxynitride, or stacked layers of at least two of the materials above; and the organic material is, for instance (but not limited to): a polymer material such as polyimide resin, epoxy resin, or acrylic resin.

The second metal layer 110b is formed in a contact hole Vb in the flat layer PL to be electrically connected to the first metal layer 110a. The material of the second metal layer 110b includes (but is not limited to): aluminum, molybdenum, titanium, gold, indium, tin, or a combination thereof. Moreover, in the present embodiment, the light-emitting diode 120 is electrically connected to the first metal layer 110a used as the source/drain electrode via the second metal layer 110b. In other words, in the present embodiment, the light-emitting diode 120 and the second metal layer 110b are electrically connected, and the second metal layer 110b is used as a connecting electrode.

The light-emitting diode 120 is disposed on the metal layer 110. In the present embodiment, the light-emitting diode 120 includes a light-emitting diode body LB and an electrode 126a. Specifically, in the present embodiment, the light-emitting diode body LB in the light-emitting diode 120 is electrically connected to the second metal layer 110b of the metal layer 110 via the electrode 126a. However, similarly, since the metal layer 110 can also only include the first metal layer 110a, at this point, the light-emitting diode body LB is electrically connected to the first metal layer 110a via the electrode 126a. Moreover, in the present embodiment, the light-emitting diode 120 further includes an electrode 126b. Moreover, in the present embodiment, the light-emitting diode 120 is a vertical type micro light-emitting diode.

In the present embodiment, the light-emitting diode body LB has a surface S1 and a surface S2 opposite to the surface S1, the surface S1 and the surface S2 are both parallel to the substrate 100, and in the direction D, a distance A2 is between the surface S1 and the surface S2. In an embodiment, the distance A2 can be greater than or equal to 2 μm and less than or equal to 12 μm. In another embodiment, the distance A2 can be greater than or equal to 3 μm and less than or equal to 10 μm. In another embodiment, the distance A2 can be greater than or equal to 4 μm and less than or equal to 8 μm.

It should be mentioned that, in an embodiment, the ratio of the distance A2 to the distance A1 can be greater than or equal to 0.25 and less than or equal to 6. In another embodiment, the ratio of the distance A2 to the distance A1 can be greater than or equal to 0.6 and less than or equal to 5. In another embodiment, the ratio of the distance A2 to the distance A1 can be greater than or equal to 1 and less than or equal to 4. If the ratio of the distance A2 to the distance A1 is less than 0.25, then the structural strength of the display apparatus 10 may be weakened; and if the ratio of the distance A2 to the distance A1 is greater than 6, then the luminous efficiency or efficiency of heat dissipation . . . etc. of the display apparatus 10 may be reduced.

Moreover, in the present embodiment, to increase the luminous efficiency of the display apparatus 10, the surface S2 can have a plurality of grooves M. That is, the surface S2 is a rugged and uneven surface. Therefore, in the present embodiment, the distance A2 is in actuality the length between the highest point of the surface S2 to the surface S1. Specifically, in the present embodiment, the depth of the grooves M is about 0.25 μm to 1 μm. However, the disclosure is not limited thereto. In other embodiments, the surface S2 can also be a flat surface. For instance, the surface S2 may not have the plurality of grooves M, and the distance A2 can be directly measured from the surface S2 to the surface S1. As another example, the surface S2 can have grooves M having a depth less than 0.2 μm, and the distance A2 is the length between the highest point of the surface S2 to the surface S1.

In the present embodiment, the light-emitting diode body LB includes a first conductivity type semiconductor layer 122a, an active layer 124, and a second conductivity type semiconductor layer 122b. The active layer 124 is disposed on the first conductivity type semiconductor layer 122a. The second conductivity type semiconductor layer 122b is disposed on the active layer 124. The material of the first conductivity type semiconductor layer 122a is, for instance (but not limited to): GaN doped with a first conductivity type dopant or other suitable materials such as GaN doped with magnesium. The material of the active layer 124 is, for instance (but not limited to): a multiple quantum well, and the material thereof is, for instance, InGaN/GaN or other suitable materials. The material of the second conductivity type semiconductor layer 122b is, for instance (but not limited to): GaN doped with a second conductivity type dopant or other suitable materials such as GaN doped with silicon. Moreover, in the present embodiment, the first conductivity type semiconductor layer 122a is, for instance, a P-type semiconductor layer, and the second conductivity type semiconductor layer 122b is, for instance, an N-type semiconductor layer. Therefore, the electrode 126a in contact with the first conductivity type semiconductor layer 122a is, for instance, a P-type electrode, and the electrode 126b in contact with the second conductivity type semiconductor layer 122b is, for instance, an N-type electrode. However, the disclosure is not limited thereto. In other embodiments, the first conductivity type semiconductor layer 122a is, for instance, an N-type semiconductor layer, and the second conductivity type semiconductor layer 122b is, for instance, a P-type semiconductor layer. Therefore, the electrode 126a in contact with the first conductivity type semiconductor layer 122a is, for instance, an N-type electrode, and the electrode 126b in contact with the second conductivity type semiconductor layer 122b is, for instance, a P-type electrode.

It should be mentioned that, in the present embodiment, the surface S1 is the bottom surface of the first conductivity type semiconductor layer 122a, and the surface S2 is the top surface of the second conductivity type semiconductor layer 122b. In other words, in the present embodiment, the distance A2 is the length between the bottom surface of the first conductivity type semiconductor layer 122a and the top surface of the second conductivity type semiconductor layer 122b. Moreover, as described above, to increase the luminous efficiency of the display apparatus 10, the surface S2 of the light-emitting diode body LB can have a plurality of grooves M, and therefore in the present embodiment, the second conductivity type semiconductor layer 122b has a plurality of grooves M.

In the present embodiment, the conductive adhesive layer 130 is used to electrically connect the electrode 126a of the light-emitting diode 120 and the second metal layer 110b of the metal layer 110. The material of the conductive adhesive layer 130 is, for instance (but not limited to): anisotropic conductive adhesive (ACA). Based on storage appearance, ACA includes anisotropic conductive paste (ACP) and anisotropic conductive film (ACF). However, the disclosure is not limited thereto, and any person having ordinary skill in the art can electrically connect the electrode 126a of the light-emitting diode 120 and the second metal layer 110b of the metal layer 110 via any known bonding method. For instance, the electrode 126a of the light-emitting diode 120 and the second metal layer 110b of the metal layer 110 can also be electrically connected to each other via a eutectic bonding method. Moreover, as described above, since the metal layer 110 can also only include the first metal layer 110a, at this point, the conductive adhesive layer 130 is used to electrically connect the electrode 126a of the light-emitting diode 120 and the first metal layer 110a.

Moreover, an insulating layer IL4 further covers the conductive adhesive layer 130. The material of the insulating layer IL4 can be (but is not limited to): inorganic material, organic material, or a combination thereof, wherein the inorganic material is, for instance (but not limited to): silicon oxide, silicon nitride, silicon oxynitride, or stacked layers of at least two of the materials above; and the organic material is, for instance (but not limited to): a polymer material such as polyimide resin, epoxy resin, or acrylic resin.

In the present embodiment, the opposite substrate 140 includes a substrate 142, a color filter layer CF, a wavelength conversion layer WT, a light-blocking pattern layer BK, and an adhesive layer 144 disposed on the substrate 142. However, the disclosure is not limited thereto. In other embodiments, only the color filter layer CF or the wavelength conversion layer WT may be disposed on the substrate 142.

The material of the substrate 142 can be, for instance, glass, quartz, organic polymer, or metal material, wherein the organic polymer is, for instance (but not limited to): polyimide (PI), polyethylene terephthalate (PET), or polycarbonate (PC).

The color filter layer CF can be any color filter layer known to any person having ordinary skill in the art. For instance, the color filter layer CF can include a red filter pattern, a green filter pattern, and a blue filter pattern.

The wavelength conversion layer WT is disposed in correspondence to the light-emitting diode 120. The wavelength conversion layer WT can be any wavelength conversion layer known to any person having ordinary skill in the art. For instance, the material of the wavelength conversion layer WT can include (but is not limited to): a quantum dot material, a fluorescent powder material, a phosphor powder material, or a combination thereof.

The light-blocking pattern layer BK is disposed in correspondence to the wavelength conversion layer WT. Specifically, in the present embodiment, the light-blocking pattern layer BK can be used to shield devices and traces in the display apparatus 10 not to be seen by the user such as scan lines (not shown), data lines (not shown), and the transistor T. Moreover, the light-blocking pattern layer BK is, for instance, a black matrix (BM). Moreover, the material of the light-blocking pattern layer BK includes, for instance (but is not limited to): black resin, other colored resins, black photoresist, other colored photoresists, metal, or a single-layer or multi-layer structure formed by the above.

The adhesive layer 144 is disposed between the color filter layer CF and the wavelength conversion layer WT, and the color filter layer CF and the light-blocking pattern layer BK to adhere the color filter layer CF, the wavelength conversion layer WT, and the light-blocking pattern layer BK. The material of the adhesive layer 144 includes, for instance (but is not limited to): an organic insulating material, an inorganic insulating material, an insulating material formed by mixing organic insulating material and inorganic insulating material, or a structure stacked by the above materials.

It should be mentioned that, the opposite substrate 140 of the present embodiment includes the color filter layer CF, the wavelength conversion layer WT, the light-blocking pattern layer BK, and the adhesive layer 144 disposed on the substrate 142. However, the disclosure is not limited thereto. In other embodiments, the opposite substrate 140 can be any opposite substrate known to any person having ordinary skill in the art. Moreover, in the present embodiment, the display apparatus 10 includes the opposite substrate 140, but the disclosure is not limited thereto. In other embodiments, the display apparatus 10 can also not include the opposite substrate.

Moreover, in the present embodiment, the adhesive layer 144 is located between the color filter layer CF and the wavelength conversion layer WT, but the disclosure is not limited thereto. In other embodiments, the color filter layer CF can also be located between the adhesive layer 144 and the wavelength conversion layer WT, i.e., the adhesive layer 144 can be in direct contact with the substrate 142.

It should be mentioned that, as described above, in the present embodiment, in the direction D, the ratio of the distance A2 between the surface S1 and the surface S2 of the light-emitting diode 120 to the distance A1 between the upper surface TS of the metal layer 110 and the substrate 100 is greater than or equal to 0.25 and less than or equal to 6, and therefore the display apparatus 10 can have good luminous efficiency or good structural strength.

Moreover, although the light-emitting diode 120 in the embodiment of FIG. 1 is a vertical type micro light-emitting diode, the disclosure is not limited thereto. In other embodiments, the light-emitting diode can also be a flip-chip type micro light-emitting diode. In the following, description is provided with reference to FIG. 2. It should be mentioned here that, the embodiments below adopt the reference numerals of the embodiments above and a portion of the content thereof, wherein the same or similar reference numerals are used to represent the same or similar devices and descriptions of the same technical content are omitted. The omitted portions are described in the previous embodiments and are not repeated in the following embodiments.

Figure 2:
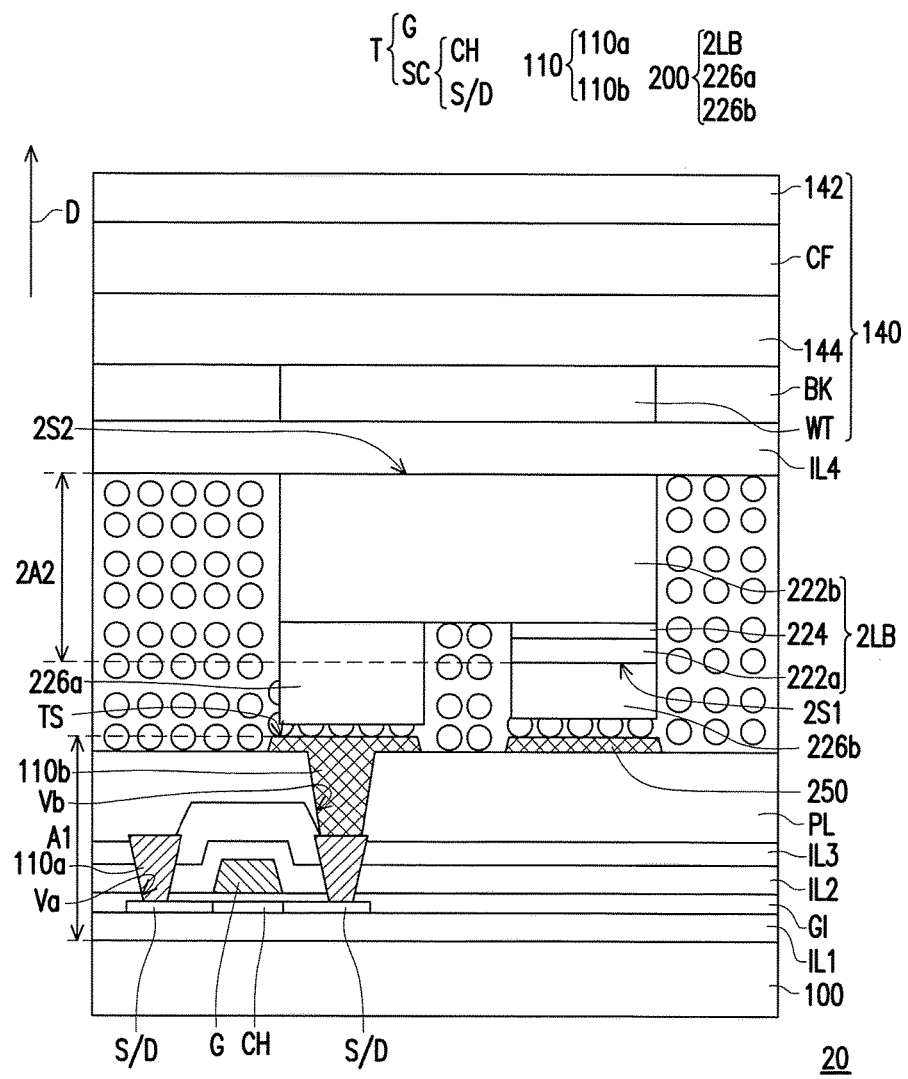
FIG. 2 is a cross-sectional schematic diagram of a display apparatus of another embodiment of the disclosure.

FIG. 2 is a cross-sectional schematic diagram of a display apparatus of another embodiment of the disclosure. Referring to both FIG. 2 and FIG. 1, in a display apparatus 20, a light-emitting diode 220 is a flip-chip type micro light-emitting diode; and in the display apparatus 10, the light-emitting diode 120 is a vertical type micro light-emitting diode. In the following, the differences between the embodiment of FIG. 2 and the embodiment of FIG. 1 are described.

Referring to FIG. 2, the light-emitting diode 220 includes a light-emitting diode body 2LB, an electrode 226a, and an electrode 226b, wherein the light-emitting diode body 2LB includes a first conductivity type semiconductor layer 222a, an active layer 224, and a second conductivity type semiconductor layer 222b. Specifically, in the present embodiment, the second conductivity type semiconductor layer 222b is disposed on the electrode 226a and the electrode 226b, the first conductivity type semiconductor layer 222a is disposed between the second conductivity type semiconductor layer 222b and the electrode 226b, and the light-emitting diode body 2LB in the light-emitting diode 220 is electrically connected to the second metal layer 110b of the metal layer 110 via the electrode 226a.

In the present embodiment, the material of the first conductivity type semiconductor layer 222a is, for instance (but not limited to): GaN doped with a first conductivity type dopant or other suitable materials such as GaN doped with magnesium. The material of the active layer 224 is, for instance (but not limited to): a multiple quantum well, and the material thereof is, for instance, InGaN/GaN or other suitable materials. The material of the second conductivity type semiconductor layer 222b is, for instance (but not limited to): GaN doped with a second conductivity type dopant or other suitable materials such as GaN doped with silicon. Moreover, in the present embodiment, the first conductivity type semiconductor layer 222a is, for instance, a P-type semiconductor layer, and the second conductivity type semiconductor layer 222b is, for instance, an N-type semiconductor layer. Therefore, the electrode 226b in contact with the first conductivity type semiconductor layer 222a is, for instance, a P-type electrode, and the electrode 226a in contact with the second conductivity type semiconductor layer 222b is, for instance, an N-type electrode. However, the disclosure is not limited thereto. In other embodiments, the first conductivity type semiconductor layer 222a is, for instance, an N-type semiconductor layer, and the second conductivity type semiconductor layer 222b is, for instance, a P-type semiconductor layer. Therefore, the electrode 226b in contact with the first conductivity type semiconductor layer 222a is, for instance, an N-type electrode, and the electrode 226a in contact with the second conductivity type semiconductor layer 222b is, for instance, a P-type electrode.

In the present embodiment, the light-emitting diode body 2LB has a surface 2S1 and a surface 2S2 opposite to the surface 2S1, the surface 2S1 and the surface 2S2 are both parallel to the substrate 100, and in the direction D, a distance 2A2 is between the surface 2S1 and the surface 2S2. In an embodiment, the distance 2A2 can be greater than or equal to 2 μm and less than or equal to 12 μm. In another embodiment, the distance 2A2 can be greater than or equal to 3 μm and less than or equal to 10 μm. In another embodiment, the distance 2A2 can be greater than or equal to 4 μm and less than or equal to 8 μm.

It should be mentioned that, in an embodiment, the ratio of the distance 2A2 to the distance A1 can be greater than or equal to 0.25 and less than or equal to 6. In another embodiment, the ratio of the distance 2A2 to the distance A1 can be greater than or equal to 0.6 and less than or equal to 5. In another embodiment, the ratio of the distance 2A2 to the distance A1 can be greater than or equal to 1 and less than or equal to 4. If the ratio of the distance 2A2 to the distance A1 is less than 0.25, then the structural strength of the display apparatus 20 may be weakened; and if the ratio of the distance 2A2 to the distance A1 is greater than 6, then the luminous efficiency or efficiency of heat dissipation . . . etc. of the display apparatus 20 may be reduced.

It should be mentioned that, in the present embodiment, the surface 2S1 is the bottom surface of the first conductivity type semiconductor layer 222a, and the surface 2S2 is the top surface of the second conductivity type semiconductor layer 222b. In other words, in the present embodiment, the distance 2A2 is the length between the bottom surface of the first conductivity type semiconductor layer 222a and the top surface of the second conductivity type semiconductor layer 222b. Moreover, in FIG. 2, although the surface 2S2 is a flat surface, based on the descriptions related to FIG. 1, any person having ordinary skill in the art should understand that, to increase the luminous efficiency of the display apparatus 20, the surface 2S2 can also have a plurality of grooves. In other words, at this point, the distance 2A2 is in actuality the length between the highest point of the surface 2S2 and the surface 2S1, and the second conductivity type semiconductor layer 222b has a plurality of grooves.

In the present embodiment, the display apparatus 20 further includes an electrode pattern 250 disposed on the flat layer PL. Specifically, in the present embodiment, the electrode pattern 250 and the second metal layer 110b may belong to the same film layer and have the same material. In other words, in the present embodiment, the electrode pattern 250 and the second metal layer 110b are, for instance, formed together in the same lithography and etching process. In the present embodiment, the material of the electrode pattern 250 and the second metal layer 110b is, for instance (but not limited to): aluminum, molybdenum, titanium, gold, indium, tin, or a combination thereof.

Moreover, in the present embodiment, the light-emitting diode body 2LB is electrically connected to the second metal layer 110b via the electrode 226a and electrically connected to the electrode pattern 250 via the electrode 226b. More specifically, in the present embodiment, the electrode 226a and the electrode 226b are respectively electrically connected to the second metal layer 110b and the electrode pattern 250 via the conductive adhesive layer 130. Similarly, the disclosure is not limited thereto, and any person having ordinary skill in the art can electrically connect the electrode 226a and the second metal layer 110b and electrically connect the electrode 226b and the electrode pattern 250 via any known bonding method. For instance, the electrode 226a and the electrode 226b can also be respectively electrically connected to the second metal layer 110b and the electrode pattern 250 via a eutectic bonding method.

It should be mentioned that, as described above, in the present embodiment, in the direction D, the ratio of the distance 2A2 between the surface 2S1 and the surface 2S2 of the light-emitting diode 220 to the distance A1 between the upper surface TS of the metal layer 110 and the substrate 100 is greater than or equal to 0.25 and less than or equal to 6, and therefore the display apparatus 20 can have good luminous efficiency or good structural strength.

Moreover, in the embodiment of FIG. 1, the light-emitting diode 120 includes the light-emitting diode body LB, the electrode 126a, and the electrode 126b, and in the embodiment of FIG. 2, the light-emitting diode 220 includes the light-emitting diode body 2LB, the electrode 226a, and the electrode 226b, but the disclosure is not limited thereto. In other embodiments, the light-emitting diode can further include a buffer layer disposed on the light-emitting diode body. In the following, detailed description is provided with reference to FIG. 3 and FIG. 4.

Figure 3:
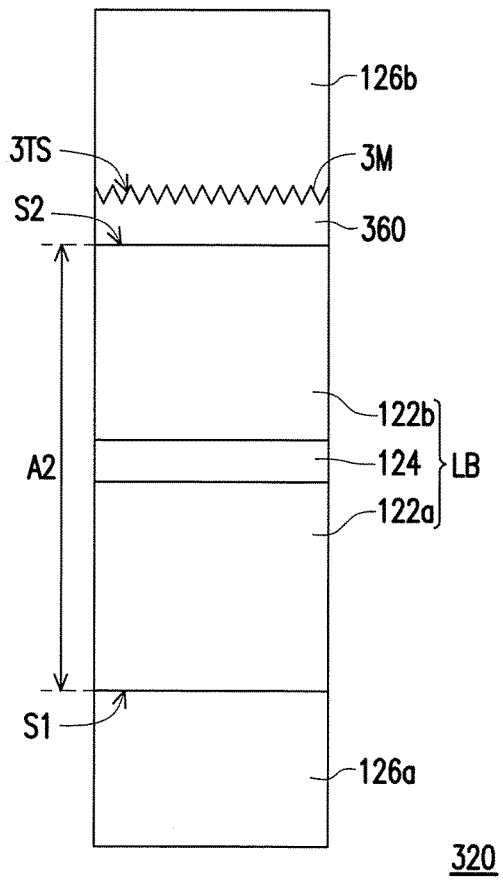
FIG. 3 is a cross-sectional schematic diagram of a light-emitting diode of another embodiment of the disclosure.

FIG. 3 is a cross-sectional schematic diagram of a light-emitting diode of another embodiment of the disclosure. Referring to both FIG. 3 and FIG. 1, a light-emitting diode 320 of FIG. 3 is similar to the light-emitting diode 120 of FIG. 1, and therefore the same or similar devices are represented by the same or similar reference numerals, and relevant descriptions are not repeated. In the following, the differences between the two are described.

Referring to FIG. 3, a buffer layer 360 is disposed on the light-emitting diode body LB, and the top surface S3 of the buffer layer 360 has a plurality of grooves 3M. Specifically, in the present embodiment, the buffer layer 360 is located between the second conductivity type semiconductor layer 122b of the light-emitting diode body LB and the electrode 126b. In the present embodiment, the material of the buffer layer 360 includes (but is not limited to): aluminum oxide ($Al_2O_3$), undoped gallium nitride (GaN), silicon nitride, silicon oxide, or a stacked structure or the above materials. Moreover, in the present embodiment, the depth of the grooves 3M is about 0.25 μm to 1 μm.

It should be mentioned that, in the present embodiment, the light-emitting diode 320 includes the buffer layer 360 disposed on the light-emitting diode body LB and the top surface S3 of the buffer layer 360 has the plurality of grooves 3M, and therefore the luminous efficiency of the display apparatus 30 can be increased without disposing the grooves M on the surface S2 of the light-emitting diode body LB. As a result, in the present embodiment, the surface S2 of the light-emitting diode body LB is a flat surface, and the distance A2 can be directly measured from the surface S2 to the surface S1.

Figure 4:
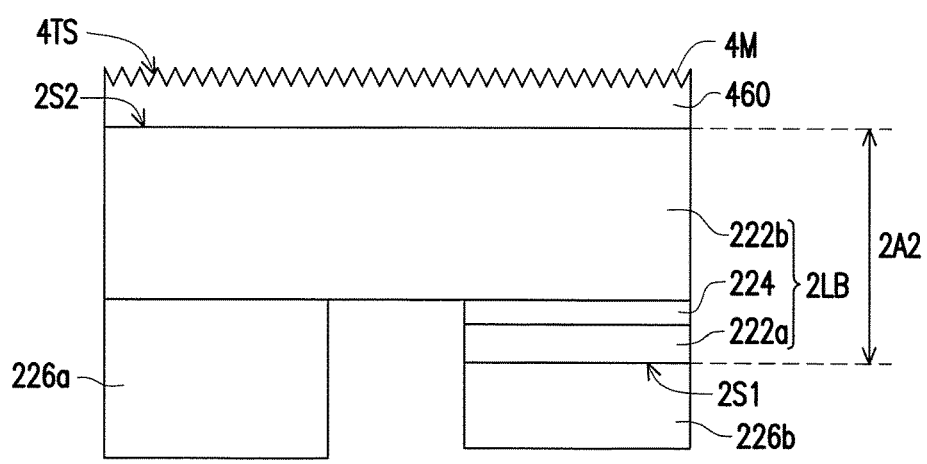
FIG. 4 is a cross-sectional schematic diagram of a light-emitting diode of another embodiment of the disclosure.

FIG. 4 is a cross-sectional schematic diagram of a light-emitting diode of another embodiment of the disclosure. Referring to both FIG. 4 and FIG. 2, a light-emitting diode 420 of FIG. 4 is similar to the light-emitting diode 220 of FIG. 2, and therefore the same or similar devices are represented by the same or similar reference numerals, and relevant descriptions are not repeated. In the following, the differences between the two are described.

Referring to FIG. 4, a buffer layer 460 is disposed on the light-emitting diode body 2LB, and a top surface S4 of the buffer layer 460 has a plurality of grooves 4M. Specifically, in the present embodiment, the buffer layer 460 is located on the second conductivity type semiconductor layer 222b of the light-emitting diode body 2LB. In the present embodiment, the material of the buffer layer 460 includes (but is not limited to): $Al_2O_3$, undoped GaN, silicon nitride, silicon oxide, or a stacked structure of the above materials. Moreover, in the present embodiment, the depth of the grooves 4M is about 0.25 μm to 1 μm.

It should be mentioned that, in the present embodiment, the light-emitting diode 420 includes the buffer layer 460 disposed on the light-emitting diode body 2LB and the top surface S4 of the buffer layer 460 has the plurality of grooves 4M, and therefore the luminous efficiency of the display apparatus 40 can be increased. As a result, in the present embodiment, grooves are not needed on the surface 2S2 of the light-emitting diode body 2LB and the surface 2S2 of the light-emitting diode body 2LB is a flat surface, and the distance 2A2 can be directly measured from the surface 2S2 to the surface 2S1.

Moreover, although the embodiments of FIG. 1 to FIG. 2 disclose the transistor T is a low-temperature polysilicon thin-film transistor and although the embodiments of FIG. 1 to FIG. 4 disclose the light-emitting diodes 120, 220, 320, and 420, the disclosure is not limited thereto. Specifically, the display apparatus of the disclosure can include any type of transistor known to any person having ordinary skill in the art, such as a metal oxide thin-film transistor, an amorphous silicon thin-film transistor, a silicon-based thin-film transistor, a micro silicon thin-film transistor, or a transparent thin-film transistor; and the display apparatus of the disclosure can include any light-emitting diode structure known to any person having ordinary skill in the art, provided that the ratio of the distance between the bottom surface of the first conductivity type semiconductor layer in the light-emitting diode body and the top surface of the second conductivity type semiconductor layer to the distance between the substrate and the upper surface of the metal layer respectively electrically connected to the transistor and the light-emitting diode is greater than or equal to 0.25 and less than or equal to 6. In other words, the disclosure does not particularly limit the type of the transistor and the structure of the light-emitting diode. For instance, in the display apparatus of an embodiment, the light-emitting diode can further include a reflective structure disposed on the sidewall of the light-emitting diode body to increase the luminous efficiency of the display apparatus. In the following, the manufacturing method of the display apparatus of several embodiments is described in detail with reference to FIG. 5A to FIG. 5M, FIG. 6A to FIG. 6B, FIG. 7A to FIG. 7C, FIG. 8A to FIG. 8J, FIG. 9A to FIG. 9E, FIG. 10A to FIG. 10E, and FIG. 11A to FIG. 11G.

FIG. 5A to FIG. 5M are cross sections of the process of a manufacturing method of a display apparatus of another embodiment of the disclosure.

Figure 5A:
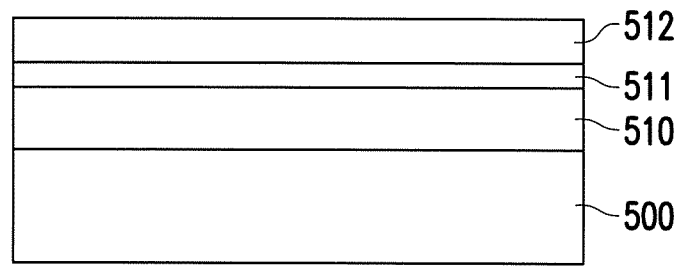
FIG. 5A to FIG. 5M are cross sections of the process of a manufacturing method of a display apparatus of another embodiment of the disclosure.

First, referring to FIG. 5A, a first conductivity type semiconductor material layer 510, an active material layer 511, and a second conductivity type semiconductor material layer 512 are formed on a substrate 500 in order. The substrate 500 is, for instance, a sapphire substrate, and the thickness thereof is, for instance, greater than or equal to 450 µm. The material of the first conductivity type semiconductor material layer 510 is, for instance (but not limited to): GaN doped with a first conductivity type dopant or other suitable materials such as GaN doped with silicon. The material of the active material layer 511 is, for instance (but not limited to): a multiple quantum well, and the material thereof is, for instance, InGaN/GaN or other suitable materials. The material of the second conductivity type semiconductor material layer 512 is, for instance (but not limited to): GaN doped with a second conductivity type dopant or other suitable materials such as GaN doped with magnesium. Moreover, the first conductivity type semiconductor material layer 510 is, for instance, an N-type semiconductor material layer, and the second conductivity type semiconductor material layer 512 is, for instance, a P-type semiconductor material layer. Moreover, the forming method of the first conductivity type semiconductor material layer 510, the active material layer 511, and the second conductivity type semiconductor material layer 512 is, for instance (but not limited to): a metal organic chemical vapor deposition (MOCVD) method, a molecular beam epitaxy (MBE) method, or other suitable epitaxial growth methods.

Figure 5B:
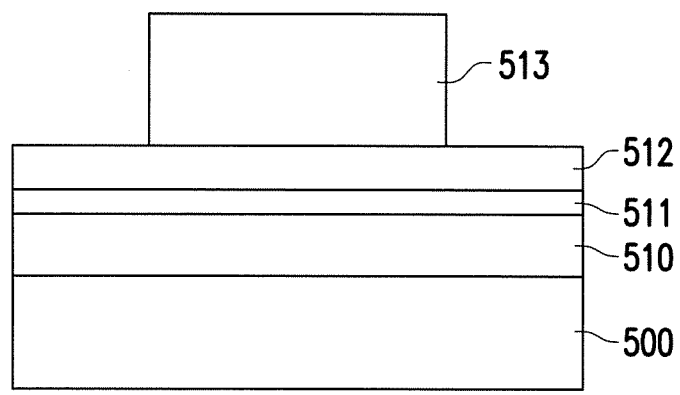

Afterwards, referring to FIG. 5B, a patterned photoresist layer 513 is formed on the second conductivity type semiconductor material layer 512. Specifically, in the present embodiment, the patterned photoresist layer 513 is formed by any half tone process known to any person having ordinary skill in the art.

Figure 5C:
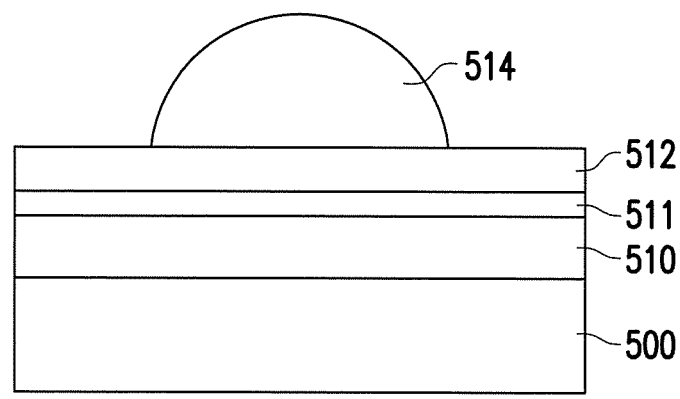

Next, referring to FIG. 5C, a reflow process is performed on the patterned photoresist layer 513 to form a reflowed patterned photoresist layer 514. Specifically, in the present embodiment, the reflowed patterned photoresist layer 514 has an arc-shaped contour. Moreover, in the present embodiment, any reflow process known to any person having ordinary skill in the art can be performed on the patterned photoresist layer 513.

Figure 5D:
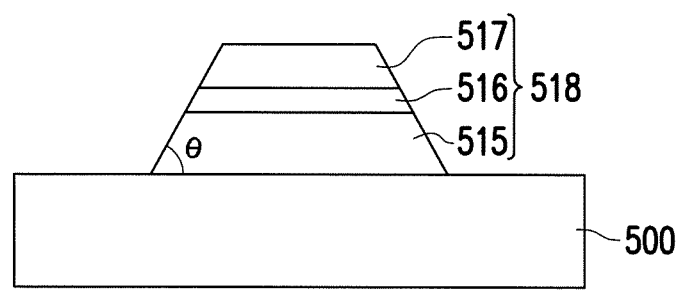

Next, referring to FIG. 5D, a portion of the first conductivity type semiconductor material layer 510, a portion of the active material layer 511, and a portion of the second conductivity type semiconductor material layer 512 are removed using the reflowed patterned photoresist layer 514 as a mask to form a first conductivity type semiconductor layer 515, an active layer 516, and a second conductivity type semiconductor layer 517. Specifically, in the present embodiment, the first conductivity type semiconductor layer 515, the active layer 516, and the second conductivity type semiconductor layer 517 form a light-emitting diode body 518, wherein the light-emitting diode body 518 is a trapezoidal structure and has an angle θ, and the angle θ is about 30 degrees to 85 degrees, preferably about 60 degrees. Moreover, in the present embodiment, the method of removing a portion of the first conductivity type semiconductor material layer 510, a portion of the active material layer 511, and a portion of the second conductivity type semiconductor material layer 512 is, for instance (but not limited to): a dry etching method. Moreover, in the present embodiment, the first conductivity type semiconductor layer 515 is, for instance, an N-type semiconductor layer, and the second conductivity type semiconductor layer 517 is, for instance, a P-type semiconductor layer.

Next, after the first conductivity type semiconductor layer 515, the active layer 516, and the second conductivity type semiconductor layer 517 are formed, the reflowed patterned photoresist layer 514 is removed. In the present embodiment, the method of removing the reflowed patterned photoresist layer 514 is, for instance (but not limited to): a wet method using a stripper solution or a dry method using plasma ashing.

Figure 5E:
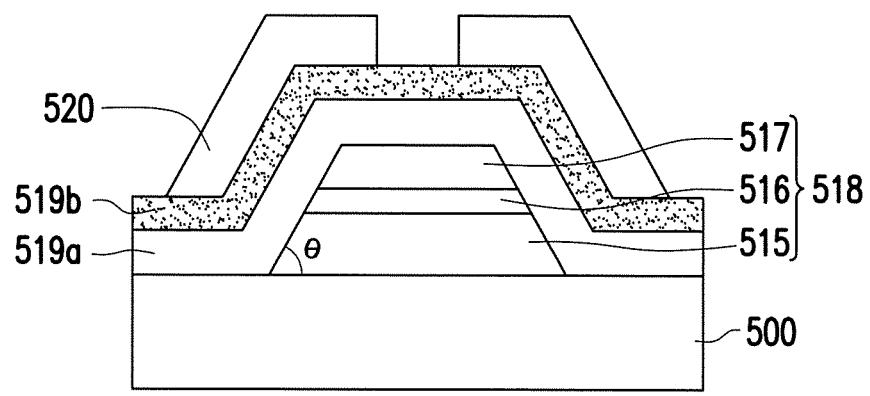

Next, referring to FIG. 5E, a material layer 519a and a material layer 519b are formed on the light-emitting diode body 518 in order. Specifically, in the present embodiment, the material layer 519a and the material layer 519b are conformally formed on the light-emitting diode body 518. Moreover, in the present embodiment, the material of the material layer 519a is an insulating material and is, for instance (but not limited to): silicon oxide or silicon nitride; the method of forming the material layer 519a is, for instance (but not limited to): a chemical vapor deposition (CVD) method or a physical vapor deposition (PVD) method; the material of the material layer 519b is a metal material and is, for instance (but not limited to): aluminum or silver; the method of forming the material layer 519b is, for instance (but not limited to): electrochemical plating (ECP) or a physical vapor deposition (PVD) method.

Next, a patterned photoresist layer 520 is formed on the material layer 519b. Specifically, in the present embodiment, the method of forming the patterned photoresist layer 520 is, for instance (but not limited to): a lithography process.

Figure 5F:
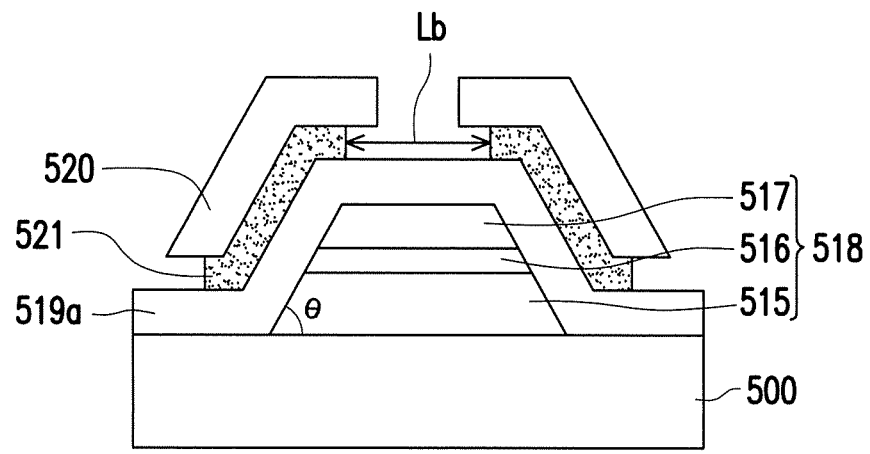

Next, referring to FIG. 5F, a first etching process is performed on the material layer 519b using the patterned photoresist layer 520 as a mask to form a reflective material layer 521 located on the sidewall of the light-emitting diode body 518. Specifically, in the present embodiment, the first etching process is preferably a wet etching process such that the reflective metal layer 512 below the patterned photoresist layer 520 has an undercut phenomenon. In other words, the edge of the patterned photoresist layer 520 is protruded beyond the edge of the reflective metal layer 521. Moreover, in the present embodiment, the reflective metal layer 521 includes two patterns separated from each other, and a distance Lb is between the two patterns.

Figure 5G:
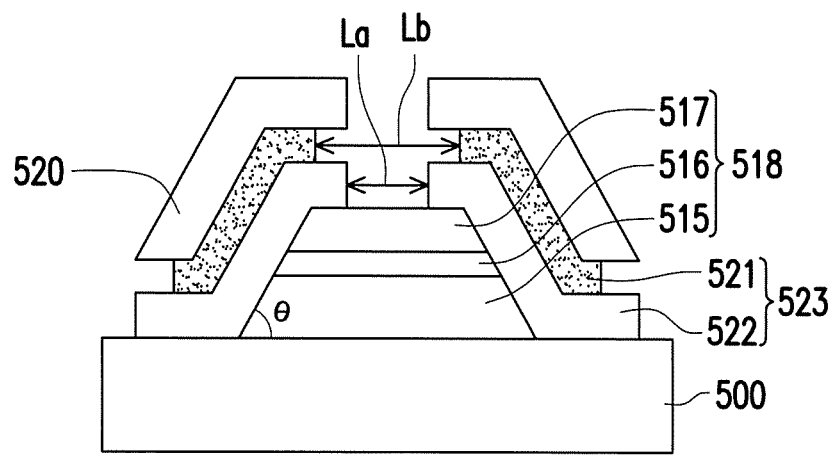

Next, referring to FIG. 5G, a second etching process is performed on the material layer 519a using the patterned photoresist layer 520 as a mask to form an insulating layer 522 located on the sidewall of the light-emitting diode body 518. Specifically, in the present embodiment, the insulating layer 522 and the reflective metal layer 521 disposed on the insulating layer 522 form a reflective structure 523 reflecting light emitted from the light-emitting diode body 518. However, the disclosure is not limited thereto. In other embodiments, the reflective layer 523 may only include the reflective metal layer 521.

In the present embodiment, since the reflective metal layer 521 and the insulating layer 522 are defined by the same mask (i.e., the patterned photoresist layer 520), the reflective structure 523 is formed in the same photomask process. Moreover, in the present embodiment, the second etching process is preferably a dry etching process such that the insulating layer 522 below the patterned photoresist layer 520 does not have an undercut phenomenon. As a result, the edge of the insulating layer 522 is protruded beyond the edge of the reflective metal layer 521. Moreover, in the present embodiment, the insulating layer 522 similarly includes two patterns separated from each other, and a distance La is between the two patterns. As described above, the edge of the insulating layer 522 is protruded beyond the edge of the reflective metal layer 521, and therefore the distance Lb is greater than the distance La.

It should be mentioned that, as described above, since the light-emitting diode body 518 has an angle θ about 30 degrees to 85 degrees, the reflective structure 523 disposed on the sidewall of the light-emitting diode body 518 can control the light emitted by the light-emitting diode body 518 to be emitted out of the same side of the light-emitting diode body 518.

Figure 5H:
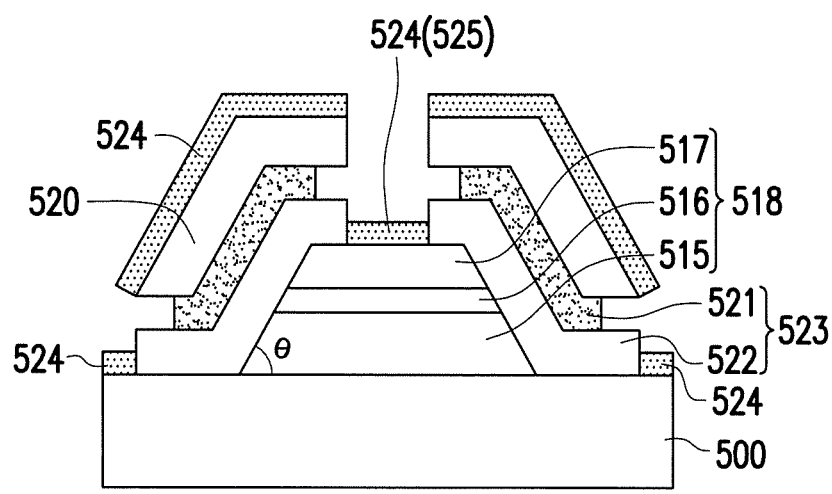

Next, referring to FIG. 5H, a conductive layer 524 is formed on the substrate 500, wherein the conductive layer 524 covers the patterned photoresist layer 520 and the second conductivity type semiconductor layer 517. Specifically, in the present embodiment, the conductive layer 524 is a discontinuous film layer. In other words, in the present embodiment, the conductive layer 524 covering the patterned photoresist layer 520, the conductive layer 524 covering the substrate 500 not covered by the patterned photoresist layer 520, and the conductive layer 524 covering the second conductivity type semiconductor layer 517 not covered by the patterned photoresist layer 520 are separate from one another. It should be mentioned that, as described above, since the edge of the patterned photoresist layer 520 and the edge of the insulating layer 522 are both protruded beyond the edge of the reflective metal layer 521, the conductive layer 524 can become a discontinuous film layer. Moreover, in the present embodiment, the material of the conductive layer 524 is, for instance (but not limited to) a nickel/gold (Ni/Au) laminated structure, a titanium/aluminum (Ti/Al) laminated structure, or other metal materials meeting contact resistance requirements; the method of forming the conductive layer 524 is, for instance (but not limited to): electrochemical plating, physical vapor deposition, or vapor deposition.

Moreover, in the present embodiment, the conductive layer 524 covering the second conductivity type semiconductor layer 517 not covered by the patterned photoresist layer 520 is used as an electrode 525. In other words, in the present embodiment, the electrode 525 is similarly defined by the patterned photoresist layer 520 defining the reflective structure 523, indicating that the electrode 525 and the reflective structure 523 are formed in the same photomask process. Moreover, in the present embodiment, the electrode 525 is, for instance, a P-type electrode.

Figure 5I:
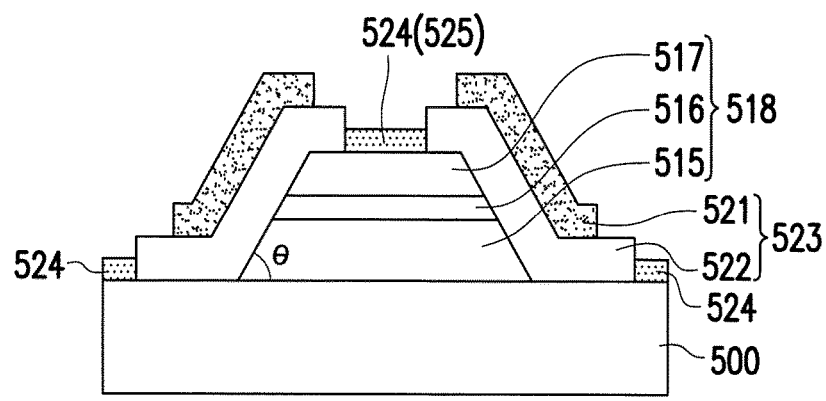

Next, referring to FIG. 5I, the patterned photoresist layer 520 and the conductive layer 524 covering the patterned photoresist layer 520 are removed and the conductive layer 524 (i.e., the electrode 525) covering the second conductivity type semiconductor layer 517 and the semiconductor layer 524 covering the substrate 500 are left. Specifically, in the present embodiment, the method of removing the patterned photoresist layer 520 is, for instance (but not limited to): a wet method using a stripper solution or a dry method using plasma ashing. It should be mentioned that, as described above, since the conductive layer 524 is a discontinuous film layer, the issue that the patterned photoresist layer 520 cannot be removed due to a continuous film layer formed thereon can be prevented.

Figure 5J:
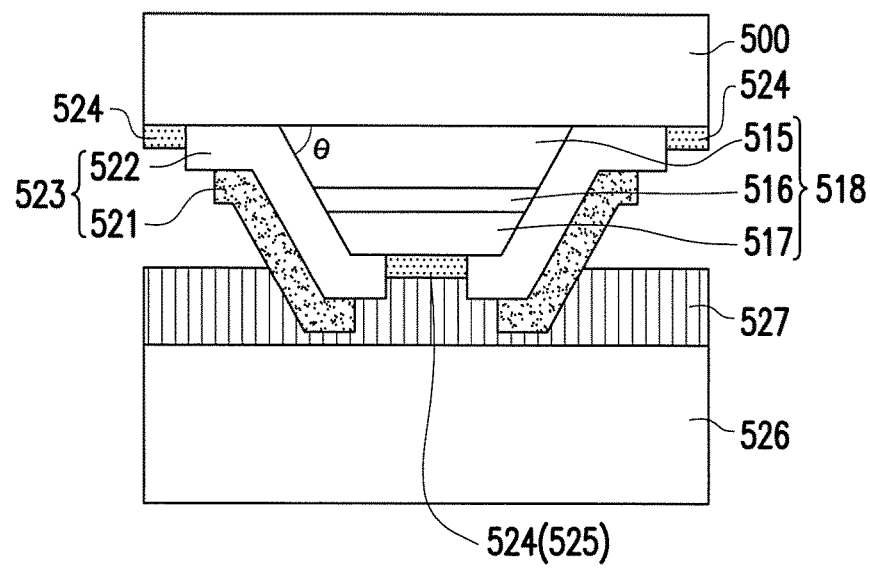

Next, referring to FIG. 5J, a carrier substrate 526 on which a bonding layer 527 is formed is provided. In the present embodiment, the material of the carrier substrate 526 is, for instance (but not limited to): glass, plastic or a chemical material such as polyimide, polyethylene terephthalate, or polycarbonate. Moreover, in the present embodiment, the material of the bonding layer 527 is, for instance (but not limited to): tin indium (Sn/In) alloy, gold (Au), copper (Cu), or other alloy materials; and the method of forming the bonding layer 527 is, for instance (but not limited to): electroplating, vapor deposition, or physical vapor deposition.

Next, the carrier substrate 526 and the substrate 500 are bonded together to form the structure shown in FIG. 5J. Specifically, in the present embodiment, the bonding layer 527 and the reflective structure 523 are in contact with each other, and the bonding layer 527 and the electrode 525 are in contact with each other.

Figure 5K:
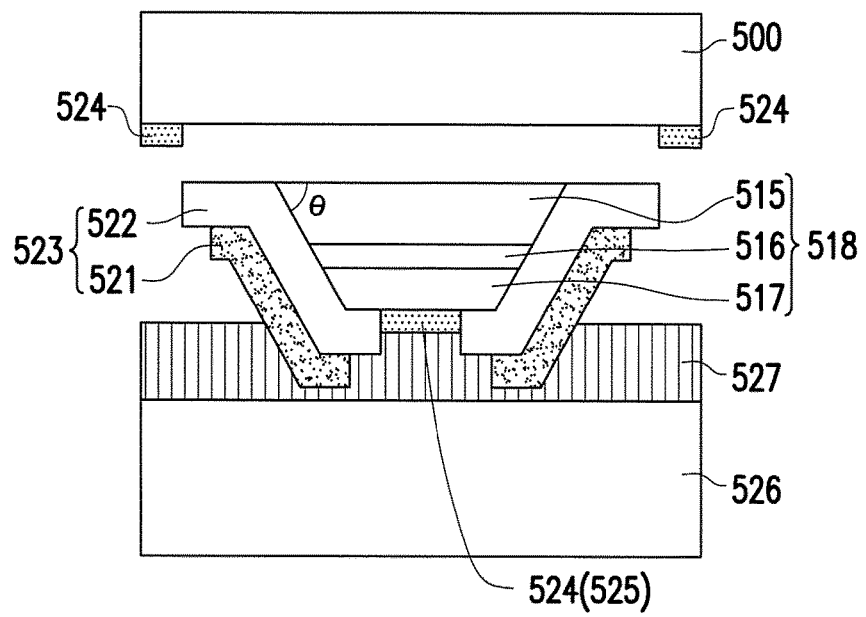

Next, referring to FIG. 5K, the substrate 500 is removed. Specifically, in the present embodiment, the method of removing the substrate 500 is, for instance (but not limited to): a laser lift-off method. It should be mentioned that, the conductive layer 524 covering the substrate 500 is also removed when the substrate 500 is removed, and the first conductivity type semiconductor layer 515 is exposed.

Figure 5L:
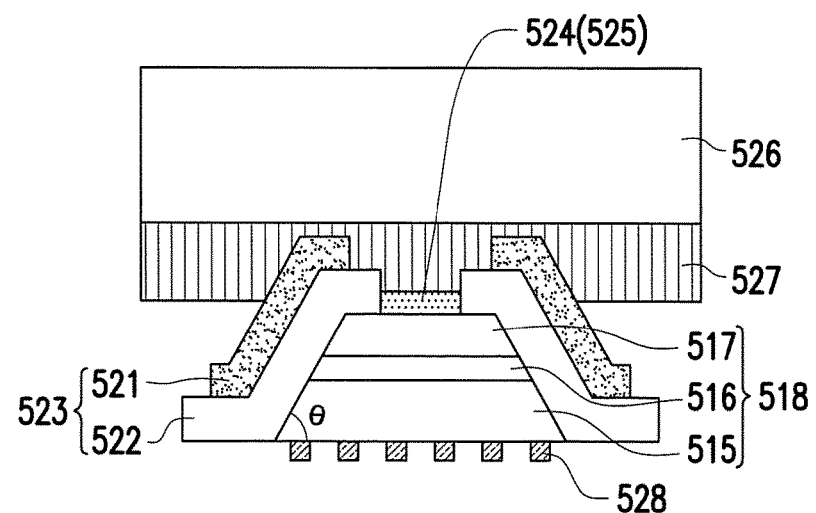

Next, referring to FIG. 5L, an electrode 528 is formed on the first conductivity type semiconductor layer 515. In the present embodiment, the material of the electrode 528 is, for instance (but not limited to): a nickel/gold (Ni/Au) laminated structure, a titanium/aluminum (Ti/Al) laminated structure, or other metal materials. Moreover, in the present embodiment, the electrode 528 is, for instance, an N-type electrode.

In an embodiment, the method of forming the electrode 528 includes (but is not limited to) the following steps: first, a patterned hard mask layer (not shown) is formed on the first conductivity type semiconductor layer 515; next, an electrode adhesive composition (not shown) is formed on the patterned hard mask layer; next, the electrode 528 is defined using an imprinting method. In another embodiment, the method of forming the electrode 528 includes (but is not limited to) the following steps: after a patterned hard mask layer (not shown) is formed on the first conductivity type semiconductor layer 515, the electrode 528 is defined using a vapor deposition method. Moreover, in the present embodiment, although the electrode 528 includes a plurality of electrode patterns separate from one another, the disclosure is not limited thereto. In other embodiments, the electrode 528 can also be a sheet electrode.

At this point, the manufacture of the light-emitting diode 529 is almost completed. Specifically, in the present embodiment, the light-emitting diode 529 includes the light-emitting diode body 518, the reflective structure 523, the electrode 525, and the electrode 528, wherein the reflective structure 523 is disposed on the sidewall of the light-emitting diode body 518 and includes the insulating layer 522 and the reflective metal layer 521 located on the insulating layer 522. As a result, a display apparatus including the light-emitting diode 529 can have good luminous efficiency. Moreover, in the present embodiment, the light-emitting diode 529 is a vertical type micro light-emitting diode.

Figure 5M:
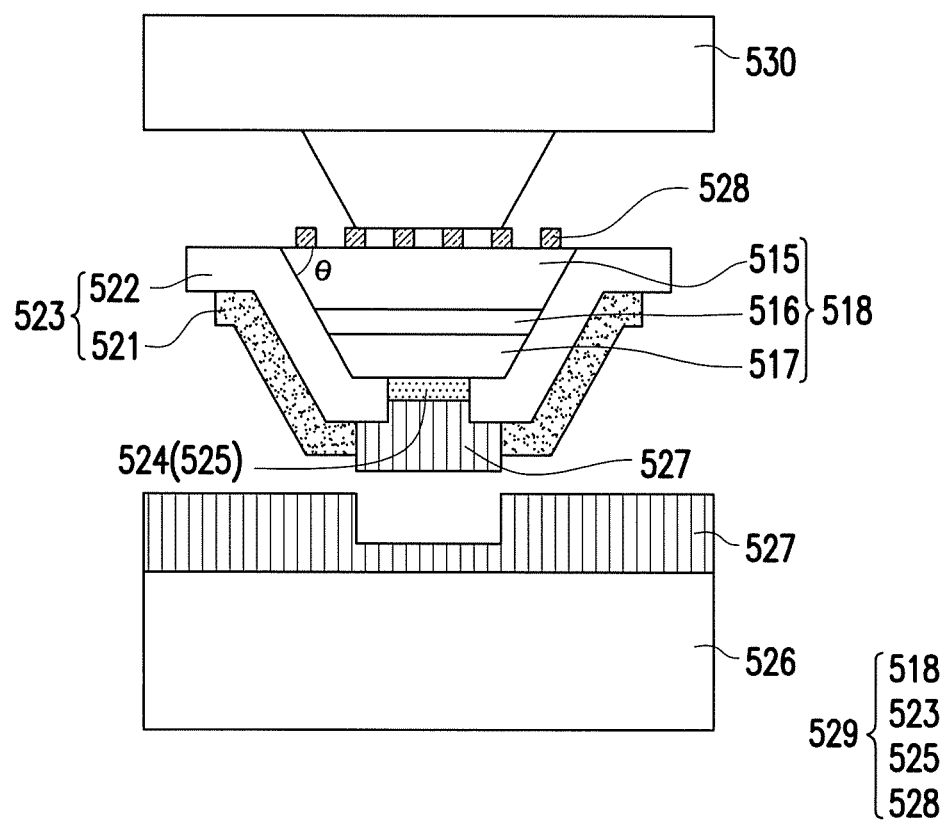

Next, referring to FIG. 5M, after a heating process is performed on the carrier substrate 526, the light-emitting diode 529 temporarily placed on the carrier substrate 526 is grabbed by a grabbing apparatus 530, wherein a portion of the bonding layer 527 is attached to the light-emitting diode 529 and in contact with the reflective structure 523 and the electrode 525. Specifically, in the present embodiment, the process temperature of the heating process is, for instance, 200° C. to 700° C., and the process time of the heating process is, for instance, 0.5 minutes to 5 minutes.

It should be mentioned that, after the operation of grabbing the light-emitting diode 529 is completed, any person having ordinary skill in the art should understand that, the light-emitting diode 529 can be assembled in a display apparatus using any known process steps according to different applications.

Moreover, in the embodiment of FIG. 5A to FIG. 5M, the reflective structure 523 is a bilayer structure, i.e., includes the insulating layer 522 and the reflective metal layer 521 stacked in order, but the disclosure is not limited thereto. In other embodiments, the reflective layer 523 can also be a structure having three or more layers. For instance, in an embodiment, the reflective structure 523 can further include another insulating layer between the insulating layer 522 and the reflective metal layer 521, and the refractive index of the other insulating layer is different from the refractive index of the insulating layer 522.

Moreover, in the embodiment of FIG. 5A to FIG. 5M, the reflective structure 523 includes the insulating layer 522 and the reflective metal layer 521 stacked in order, but the disclosure is not limited thereto. In other embodiments, the reflective layer 523 can also include two insulating layers stacked in order and having different refractive indices. In the following, detailed description is provided with reference to FIG. 6A to FIG. 6B.

Figure 6A:
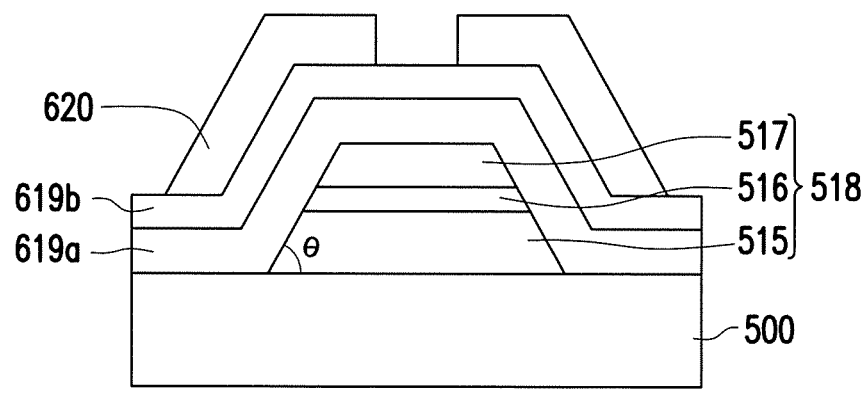
FIG. 6A to FIG. 6B are cross sections of the process of a manufacturing method of a display apparatus of another embodiment of the disclosure.
Figure 6B:
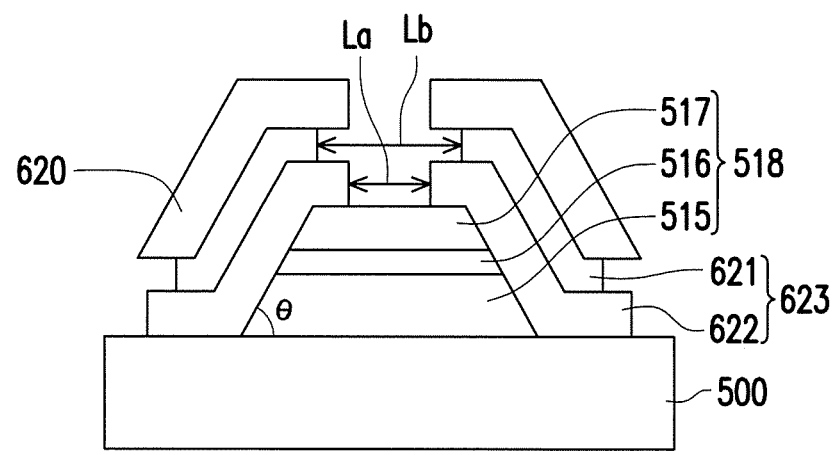

FIG. 6A to FIG. 6B are cross sections of the process of a manufacturing method of a display apparatus of another embodiment of the disclosure. FIG. 6A is a step performed after FIG. 5D. Moreover, the same or similar components in the embodiment of FIG. 6A to FIG. 6B and the embodiment of FIG. 5A to FIG. 5M can be implemented by the same material or method, and therefore the same descriptions as the embodiment of FIG. 5A to FIG. 5M are not repeated herein, and the differences between the two are mainly described.

First, referring to FIG. 6A, a material layer 619a and a material layer 619b are formed on the light-emitting diode body 518 in order. Specifically, in the present embodiment, the material layer 619a and the material layer 619b are conformally formed on the substrate 500. Moreover, in the present embodiment, the material of the material layer 619a and the material layer 619b is an insulating material, and the refractive index of the material layer 619a is different from the refractive index of the material layer 619b. In the present embodiment, the refractive index of the material layer 619b is, for instance, greater than the refractive index of the material layer 619a. Specifically, in the present embodiment, the difference between the refractive index of the material layer 619b and the refractive index of the material layer 619a is, for instance, between 0.4 and 0.9. From another perspective, in the present embodiment, the material of the material layer 619a is, for instance, silicon oxide, and the material of the material layer 619b is, for instance, silicon nitride, but the disclosure is not limited thereto. Moreover, in the present embodiment, the method of forming the material layer 619a and the material layer 619b is, for instance (but not limited to): a chemical vapor deposition method or a physical vapor deposition method.

Next, a patterned photoresist layer 620 is formed on the material layer 619b. Specifically, in the present embodiment, the method of forming the patterned photoresist layer 620 is, for instance (but not limited to): a lithography process.

Next, referring to FIG. 6B, after a first etching process is performed on the material layer 619b using the patterned photoresist layer 620 as a mask to form an insulating layer 621 located on the sidewall of the light-emitting diode body 518, a second etching process is similarly performed on the material layer 619a using the patterned photoresist layer 620 as a mask to form an insulating layer 622 located on the sidewall of the light-emitting diode body 518. Specifically, in the present embodiment, the first etching process and the second etching process are preferably dry etching processes having the same process conditions. It should be mentioned that, in the present embodiment, in the dry etching process, the etch rate of the material layer 619a is less than the etch rate of the material layer 619b. As a result, the insulating layer 621 below the patterned photoresist layer 620 has an undercut phenomenon such that the edge of the patterned photoresist layer 620 and the edge of the insulating layer 622 are protruded beyond the edge of the insulating layer 621. Moreover, in the present embodiment, the insulating layer 621 and the insulating layer 622 both respectively include two patterns separate from each other, wherein the distance Lb is between the two patterns of the insulating layer 621, and the distance La is between the two patterns of the insulating layer 622. As described above, the edge of the insulating layer 622 is protruded beyond the edge of the insulating layer 621, and therefore the distance Lb is greater than the distance La.

More specifically, in the present embodiment, the insulating layer 622 and the insulating layer 621 disposed on the insulating layer 622 form a reflective structure 623 reflecting light emitted from the light-emitting diode body 518. It should be mentioned that, in the present embodiment, since the insulating layer 621 and the insulating layer 622 are defined by the same mask (i.e., the patterned photoresist layer 620), the reflective structure 623 is formed in the same photomask process. More specifically, as described above, since the light-emitting diode body 518 has an angle θ about 30 degrees to 85 degrees, the reflective structure 623 disposed on the sidewall of the light-emitting diode body 518 can control the light emitted by the light-emitting diode body 518 to be emitted out of the same side of the light-emitting diode body 518.

It should be mentioned that, based on the contents of the embodiment of FIG. 5A to FIG. 5M and the embodiment of FIG. 6A to FIG. 6B, any person having ordinary skill in the art should understand that, after the reflective structure 623 disposed on the sidewall of the light-emitting diode body 518 is formed, the manufacture of the light-emitting diode can be completed using the same technical means according to the descriptions of FIG. 5H to FIG. 5M.

Moreover, in the embodiment of FIG. 6A to FIG. 6B, the reflective structure 623 is a bilayer structure, i.e., includes the insulating layer 622 and the insulating layer 621 stacked in order, but the disclosure is not limited thereto. In other embodiments, the reflective layer 623 can also be a structure having three or more layers. For instance, in an embodiment, the reflective structure 623 can further include another insulating layer, and the refractive index of the other insulating layer can be different from the refractive index of the insulating layer 622 and the refractive index of the insulating layer 621. As another example, in an embodiment, the reflective structure 623 can also include the insulating layer 622 and the insulating layer 621 alternately and repeatedly stacked.

Moreover, in the embodiment of FIG. 5A to FIG. 5M, the electrode 528 is directly formed on the first conductivity type semiconductor layer 515, but the disclosure is not limited thereto. In other embodiments, the electrode 528 can also be formed on the first conductivity type semiconductor layer 515 by the following steps. First, the electrode 528 is formed on an opposite substrate, and then the opposite substrate on which the electrode 528 is formed and an array substrate are assembled together. In the following, detailed description is provided with reference to FIG. 7A to FIG. 7C.

Figure 7A:
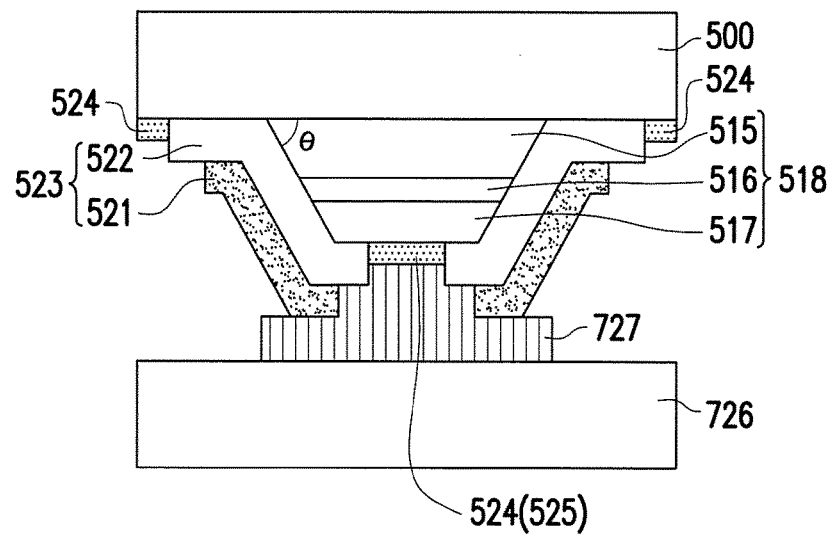
FIG. 7A to FIG. 7C are cross sections of the process of a manufacturing method of a display apparatus of another embodiment of the disclosure.
Figure 7B:
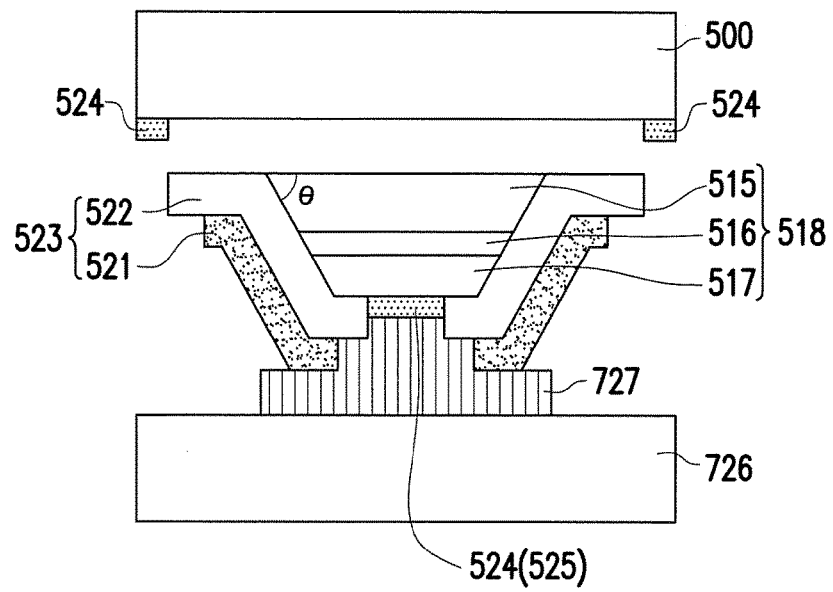
Figure 7C:
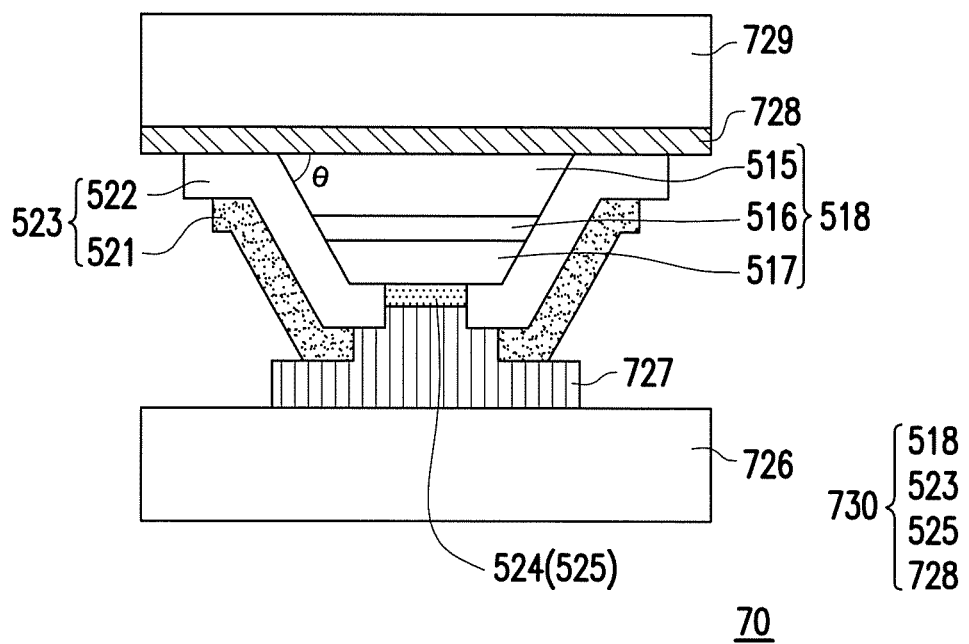

FIG. 7A to FIG. 7C are cross sections of the process of a manufacturing method of a display apparatus of another embodiment of the disclosure. FIG. 7A is a step performed after FIG. 5I. Moreover, the same or similar components in the embodiment of FIG. 7A to FIG. 7C and the embodiment of FIG. 5A to FIG. 5M can be implemented by the same material or method, and therefore the same descriptions as the embodiment of FIG. 5A to FIG. 5M are not repeated herein, and the differences between the two are mainly described.

First, referring to FIG. 7A, an array substrate 726 on which a bonding layer 727 is formed is provided. Specifically, in the present embodiment, the array substrate 726 can be any array substrate known to any person having ordinary skill in the art. For instance, in an embodiment, the array substrate 726 can include a device layer located on the substrate and formed by at least one insulating layer or at least one conductive layer or a combination of the two. Specifically, in an embodiment, the device layer can include, for instance, a plurality of scan lines, a plurality of data lines, a plurality of transistors, a plurality of electrodes, and a plurality of capacitors. From another perspective, in an embodiment, the array substrate 726 is, for instance, an active device array substrate. In another embodiment, the array substrate 726 is, for instance, a thin-film transistor (TFT) array substrate.

In the present embodiment, the material of the bonding layer 727 is, for instance (but not limited to): tin indium (Sn/In) alloy, Cu, Au, or other alloy materials, and the method of forming the bonding layer 727 is, for instance (but not limited to): electroplating, physical vapor deposition, or vapor deposition.

Next, the array substrate 726 and the substrate 500 are bonded together to form the structure shown in FIG. 7A. Specifically, in the present embodiment, the bonding layer 727 and the reflective structure 523 are in contact with each other, and the bonding layer 727 and the electrode 525 are in contact with each other.

Next, referring to FIG. 7B, the substrate 500 is removed. Since relevant descriptions of the method and steps of removing the substrate 500 are provided in detail in the embodiment of FIG. 5A to FIG. 5M, the method and steps of removing the substrate 500 are not repeated herein.

Next, referring to FIG. 7C, an opposite substrate 729 on which an electrode 728 is formed is provided. Specifically, in the present embodiment, the opposite substrate 729 can be any opposite substrate known to any person having ordinary skill in the art. For instance, in an embodiment, the opposite substrate 729 can be achieved, for instance, by the opposite substrate 140 in the embodiment of FIG. 1.

In the present embodiment, the material of the electrode 728 is, for instance, a transparent electrode material including (but not limited to): indium tin oxide (ITO) and indium zinc oxide (IZO); and the method of forming the electrode 728 is, for instance (but not limited to): physical vapor deposition, vapor deposition, or electroplating. Moreover, in the present embodiment, the electrode 728 is, for instance, an N-type electrode. Moreover, in the present embodiment, the electrode 728 is, for instance, a common electrode.

Next, the array substrate 726 and the opposite substrate 729 are assembled together to form the structure shown in FIG. 7C to complete the manufacture of a display apparatus 70 including a light-emitting diode 730. Specifically, in the present embodiment, after the array substrate 726 and the opposite substrate 729 are assembled together, the electrode 728 is in contact with the first conductivity type semiconductor layer 515 of the light-emitting diode body 518 and formed on the first conductivity type semiconductor layer 515.

It should be mentioned that, in the present embodiment, the light-emitting diode 730 includes the light-emitting diode body 518, the reflective structure 523, the electrode 525, and the electrode 728, wherein the reflective structure 523 is disposed on the sidewall of the light-emitting diode body 518 and includes the insulating layer 522 and the reflective metal layer 521 stacked in order. As a result, the display apparatus 70 can have good luminous efficiency. In another embodiment, the reflective structure 523 can also only include the reflective metal layer 521.

Moreover, in the embodiment of FIG. 7A to FIG. 7C, to improve the contact effect between the electrode 728 and the first conductivity type semiconductor layer 515, any person having ordinary skill in the art should understand that, according to the content disclosed by FIG. 5L, after the substrate 500 is removed and before the array substrate 726 and the opposite substrate 729 are assembled together, the electrode 528 can be directly formed on the first conductivity type semiconductor layer 515.

Moreover, although the light-emitting diode 529 in the embodiment of FIG. 5A to FIG. 5M is a vertical type micro light-emitting diode, the disclosure is not limited thereto. In other embodiments, the light-emitting diode can also be a flip-chip type micro light-emitting diode. In the following, description is provided with reference to FIG. 8A to FIG. 8J, FIG. 9A to FIG. 9E, FIG. 10A to FIG. 10E, and FIG. 11A to FIG. 11G.

FIG. 8A to FIG. 8J are cross sections of the process of a manufacturing method of a display apparatus of another embodiment of the disclosure.

Figure 8A:
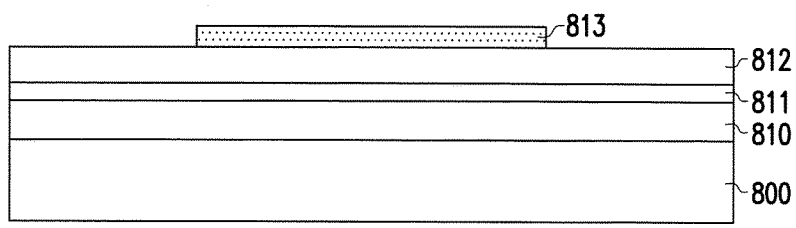
FIG. 8A to FIG. 8J are cross sections of the process of a manufacturing method of a display apparatus of another embodiment of the disclosure.

First, referring to FIG. 8A, a first conductivity type semiconductor material layer 810, an active material layer 811, and a second conductivity type semiconductor material layer 812 are formed on a substrate 800 in order. The substrate 800 is, for instance, a sapphire substrate, and the thickness thereof is, for instance, greater than or equal to 450 µm. The material of the first conductivity type semiconductor material layer 810 is, for instance (but not limited to): GaN doped with a first conductivity type dopant or other suitable materials such as GaN doped with silicon. The material of the active material layer 811 is, for instance (but not limited to): a multiple quantum well, and the material thereof is, for instance, InGaN/GaN or other suitable materials. The material of the second conductivity type semiconductor material layer 812 is, for instance (but not limited to): GaN doped with a second conductivity type dopant or other suitable materials such as GaN doped with magnesium. Moreover, the first conductivity type semiconductor material layer 810 is, for instance, an N-type semiconductor material layer, and the second conductivity type semiconductor material layer 812 is, for instance, a P-type semiconductor material layer. Moreover, the forming method of the first conductivity type semiconductor material layer 810, the active material layer 811, and the second conductivity type semiconductor material layer 812 is, for instance (but not limited to): a metal organic chemical vapor deposition method, a molecular beam epitaxy method, or other suitable epitaxial growth methods.

Next, an electrode 813 is formed on the second conductivity type semiconductor material layer 812. Specifically, in the present embodiment, the material of the electrode 813 is, for instance (but not limited to) nickel gold (Ni/Au) alloy, Ni/ITO, or other materials meeting contact resistance requirements, and the method of forming the electrode 813 is, for instance (but not limited to): a lithography and etching process. Moreover, in the present embodiment, the electrode 813 is, for instance, a P-type electrode.

Figure 8B:
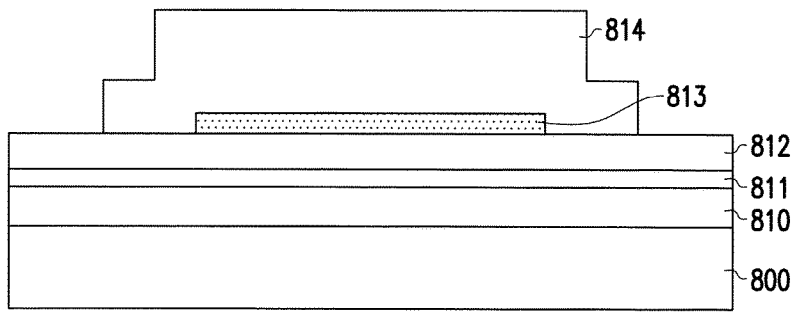

Afterwards, referring to FIG. 8B, a patterned photoresist layer 814 is formed on the second conductivity type semiconductor material layer 812. Specifically, in the present embodiment, the patterned photoresist layer 814 covers the electrode 813. Moreover, the patterned photoresist layer 814 is formed by any half tone process known to any person having ordinary skill in the art. Moreover, in the present embodiment, the patterned photoresist layer 814 has a stepped contour.

Figure 8C:
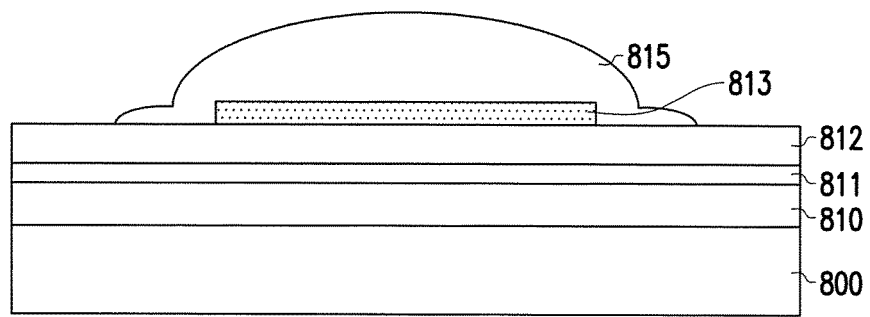

Next, referring to FIG. 8C, a reflow process is performed on the patterned photoresist layer 814 to form a reflowed patterned photoresist layer 815. Specifically, in the present embodiment, the reflowed patterned photoresist layer 815 has an arc-shaped stepped contour. Moreover, in the present embodiment, any reflow process known to any person having ordinary skill in the art can be performed on the patterned photoresist layer 814.

Figure 8D:
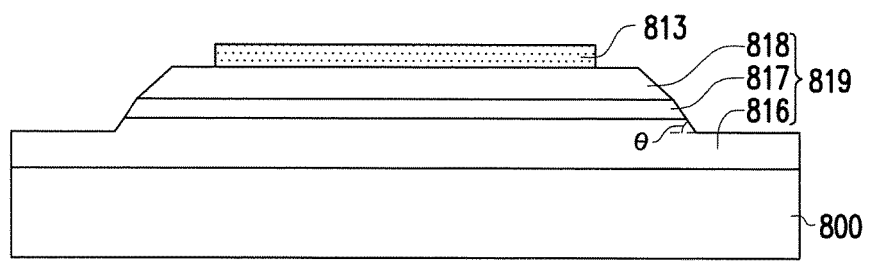

Next, referring to FIG. 8D, a portion of the first conductivity type semiconductor material layer 810, a portion of the active material layer 811, and a portion of the second conductivity type semiconductor material layer 812 are removed using the reflowed patterned photoresist layer 815 as a mask to form a first conductivity type semiconductor layer 816, an active layer 817, and a second conductivity type semiconductor layer 818. Specifically, in the present embodiment, the first conductivity type semiconductor layer 816, the active layer 817, and the second conductivity type semiconductor layer 818 form a light-emitting diode body 819, wherein the light-emitting diode body 819 has an angle θ, and the angle θ is about 30 degrees to 85 degrees, preferably about 60 degrees. Moreover, in the present embodiment, the method of removing a portion of the first conductivity type semiconductor material layer 810, a portion of the active material layer 811, and a portion of the second conductivity type semiconductor material layer 812 is, for instance (but not limited to): a dry etching method. Moreover, in the present embodiment, the first conductivity type semiconductor layer 816 is, for instance, an N-type semiconductor layer, and the second conductivity type semiconductor layer 818 is, for instance, a P-type semiconductor layer.

Next, after the first conductivity type semiconductor layer 816, the active layer 817, and the second conductivity type semiconductor layer 818 are formed, the reflowed patterned photoresist layer 815 is removed. In the present embodiment, the method of removing the reflowed patterned photoresist layer 815 is, for instance (but not limited to): a wet method using a stripper solution or a dry method using plasma ashing.

Figure 8E:
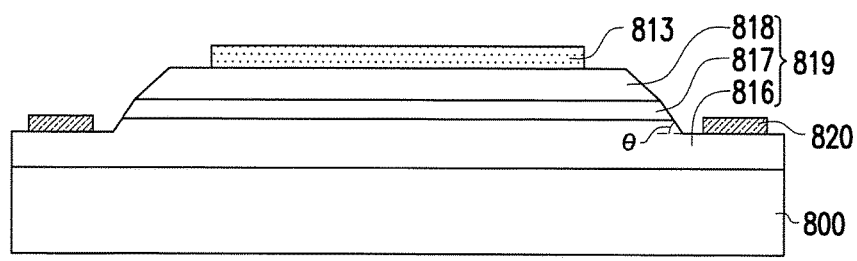

Next, referring to FIG. 8E, an electrode 820 is formed on the substrate 800. Specifically, in the present embodiment, the electrode 820 is in contact with the first conductivity type semiconductor layer 816. In the present embodiment, the material of the electrode 820 is, for instance (but not limited to): titanium aluminum (Ti/Al) alloy, titanium gold (Ti/Au) alloy, or other metal materials, and the method of forming the electrode 820 is, for instance (but not limited to): a lithography and etching process. Moreover, in the present embodiment, the electrode 820 is, for instance, an N-type electrode.

Figure 8F:
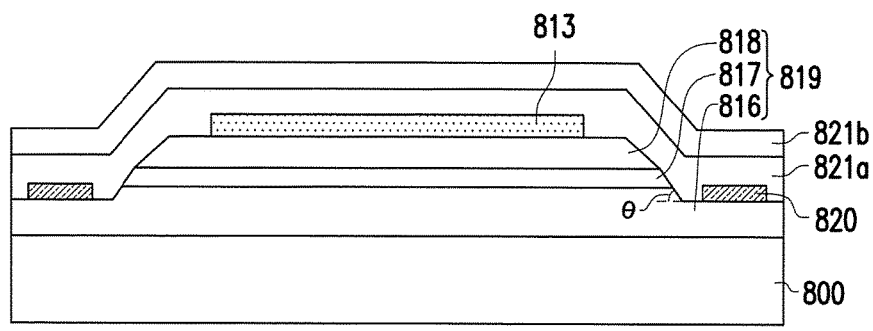

Next, referring to FIG. 8F, an insulating material layer 821a and an insulating material layer 821b are formed on the substrate 800 in order. Specifically, in the present embodiment, the insulating material layer 821a and the insulating material layer 821b are conformally formed on the substrate 800. In the present embodiment, the method of forming the insulating material layer 821a and the insulating material layer 821b is, for instance (but not limited to): a chemical vapor deposition method or a physical vapor deposition method.

Moreover, the refractive index of the insulating material layer 821a is different from the refractive index of the insulating material layer 821b. In the present embodiment, the refractive index of the insulating material layer 821b is, for instance, greater than the refractive index of the insulating material layer 821a. Specifically, in the present embodiment, the difference between the refractive index of the insulating material layer 821b and the refractive index of the insulating material layer 821a is, for instance, between 0.4 and 0.9. From another perspective, in the present embodiment, the material of the insulating material layer 821a is, for instance, silicon oxide, and the material of the insulating material layer 821b is, for instance, silicon nitride, but the disclosure is not limited thereto.

Figure 8G:
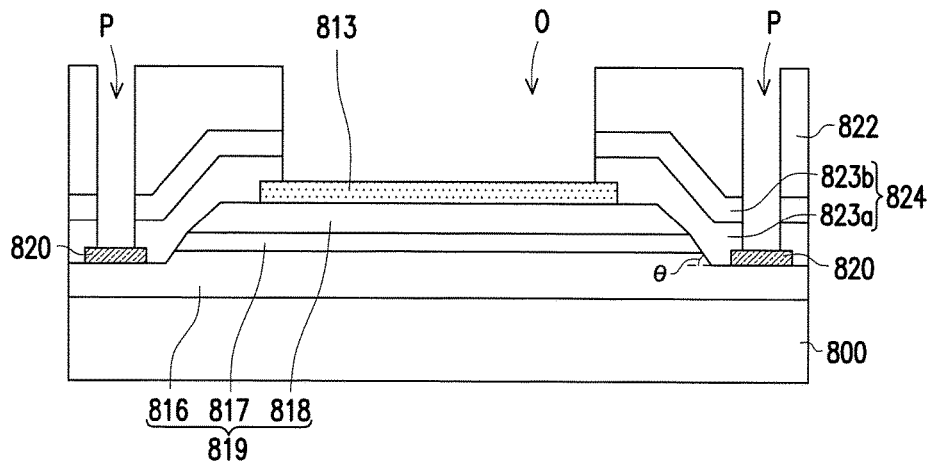

Next, referring to FIG. 8G, a portion of the insulating material layer 821a and a portion of the insulating material layer 821b are removed using a patterned organic layer 822 as a mask to form an insulating layer 823a, an insulating layer 823b, an opening O exposing the electrode 813, and an opening P exposing the electrode 820. In the present embodiment, the forming method of the patterned organic layer 822 includes (but is not limited to) the following steps: first, an organic material layer (not shown) is conformally formed on the substrate 800; next, a patterned photoresist layer (not shown) is formed on the organic material layer, and then an etching process is performed using the patterned photoresist layer as a mask to remove the organic material layer not covered by the patterned photoresist layer; next, the patterned photoresist layer is removed. Moreover, in the present embodiment, the material of the patterned organic layer 822 is, for instance (but not limited to): an organic insulating material, an inorganic insulating material, or an insulating material formed by mixing organic insulating material and inorganic insulating material. In the present embodiment, the method of removing a portion of the insulating material layer 821a and a portion of the insulating material layer 821b is, for instance (but not limited to): a dry etching method.

In the present embodiment, the insulating layer 823b is disposed on the insulating layer 823a, and the insulating layer 823a and the insulating layer 823b are disposed on the sidewall of the light-emitting diode body 819. Moreover, in the present embodiment, the insulating layer 823a and the insulating layer 823b form a reflective structure 824 reflecting light emitted from the light-emitting diode body 819. It should be mentioned that, as described above, since the light-emitting diode body 819 has an angle θ about 30 degrees to 85 degrees, the reflective structure 824 disposed on the sidewall of the light-emitting diode body 819 can control the light emitted by the light-emitting diode body 819 to be emitted out of the same side of the light-emitting diode body 819.

Figure 8H:
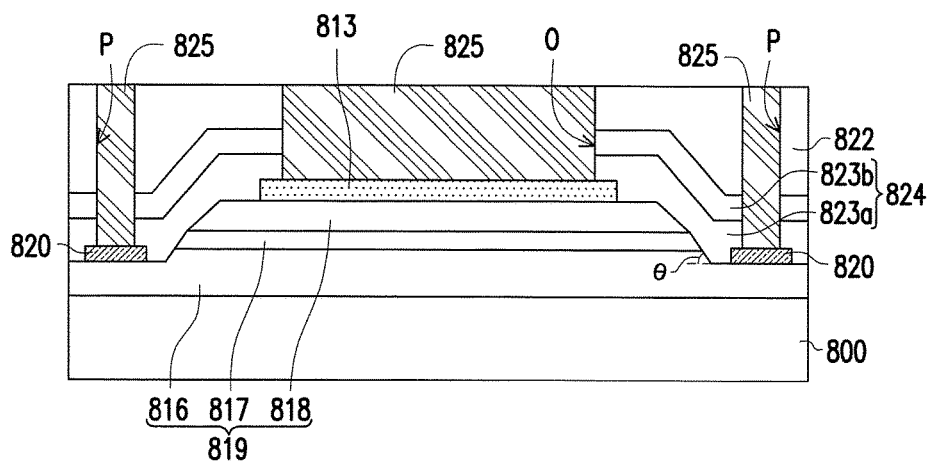

Next, referring to FIG. 8H, a bonding layer 825 is formed in the opening O and the opening P. In the present embodiment, the material of the bonding layer 825 is, for instance (but not limited to): copper, tin (Sn), or an alloy material thereof. The forming method of the bonding layer 825 includes (but is not limited to) the following steps. First, a bonding material layer (not shown) filled in the opening O and the opening P is formed on the substrate 800, and the forming method thereof is, for instance (but not limited to): an electrochemical plating method or vapor deposition. Next, the bonding material layer outside the opening O and the opening P is removed to form a bonding layer 825 in the opening O and the opening P, wherein the method of removing the bonding material layer outside the opening O and the opening P is, for instance (but not limited to): a chemical mechanical polishing method, a chemical etching method, or a physical etching method.

Figure 8I:
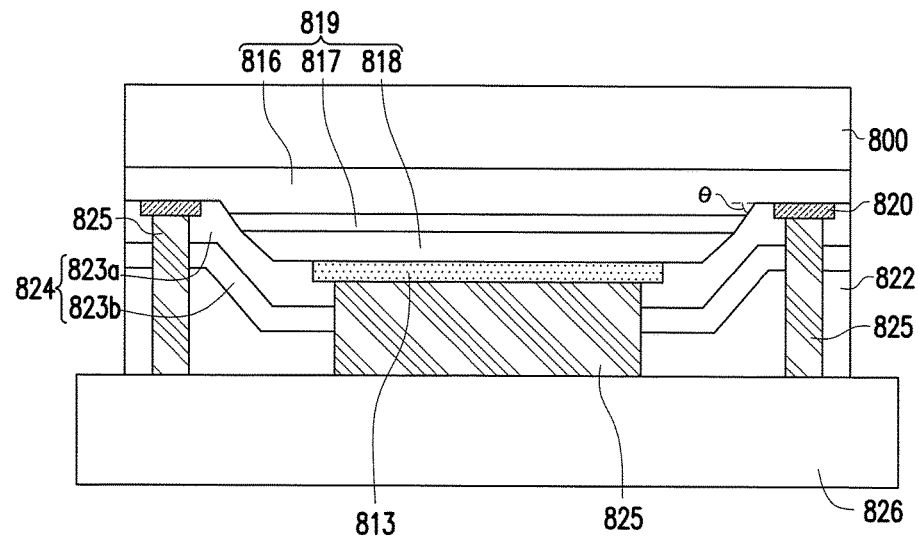

Next, referring to FIG. 8I, a carrier substrate 826 is provided. In the present embodiment, the material of the carrier substrate 826 is, for instance (but not limited to): glass, plastic, or other substrate materials meeting requirements. Next, the carrier substrate 826 and the substrate 800 are bonded together to form the structure shown in FIG. 8I. Specifically, in the present embodiment, the bonding layer 825 and the carrier substrate 826 are in contact with each other, and the patterned organic layer 822 and the carrier substrate 826 are in contact with each other.

Figure 8J:
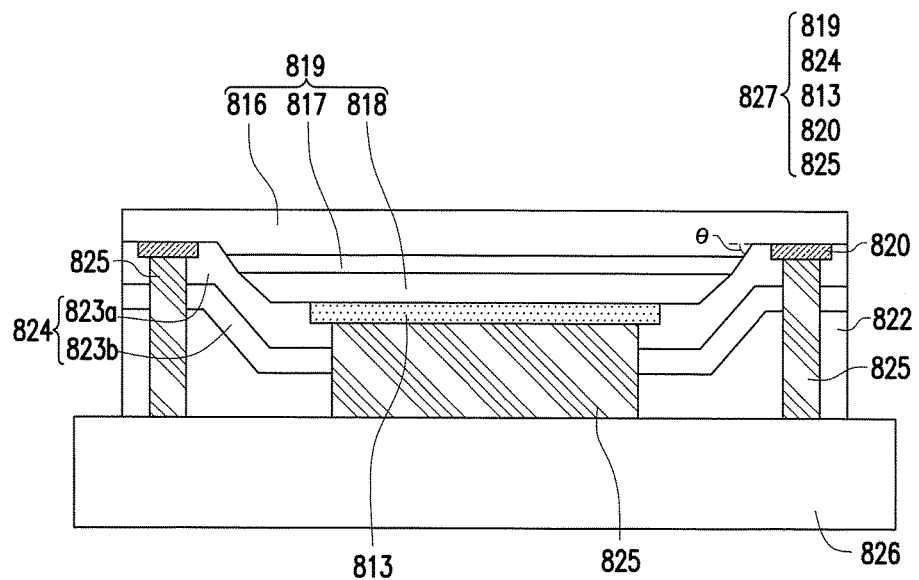

Next, referring to FIG. 8J, the substrate 800 is removed. In the present embodiment, the method of removing the substrate 800 is, for instance (but not limited to): a laser lift-off method. At this point, the manufacture of the light-emitting diode 827 is almost completed. Specifically, in the present embodiment, the light-emitting diode 827 includes the light-emitting diode body 819, the reflective structure 824, the electrode 813, the electrode 820, and the bonding layer 825, wherein the reflective structure 824 is disposed on the sidewall of the light-emitting diode body 819 and includes the insulating layer 823a and the insulating layer 823b stacked in order. As a result, a display apparatus including the light-emitting diode 827 can have good luminous efficiency. Moreover, in the present embodiment, the light-emitting diode 827 is a flip-chip type micro light-emitting diode.

It should be mentioned that, after the substrate 800 is removed, any person having ordinary skill in the art should understand that, the light-emitting diode 827 can be assembled in a display apparatus using any known process steps according to different applications.

Moreover, in the embodiment of FIG. 8A to FIG. 8J, the reflective structure 824 is a bilayer structure, i.e., includes the insulating layer 823a and the insulating layer 823b stacked in order, but the disclosure is not limited thereto. In other embodiments, the reflective layer 824 can also be a structure having three or more layers. For instance, in an embodiment, the reflective structure 824 can further include another insulating layer, and the refractive index of the other insulating layer can be different from the refractive index of the insulating layer 823a and the refractive index of the insulating layer 823b. As another example, in an embodiment, the reflective structure 824 can also include the insulating layer 823a and the insulating layer 823b alternately and repeatedly stacked.

Figure 9A:
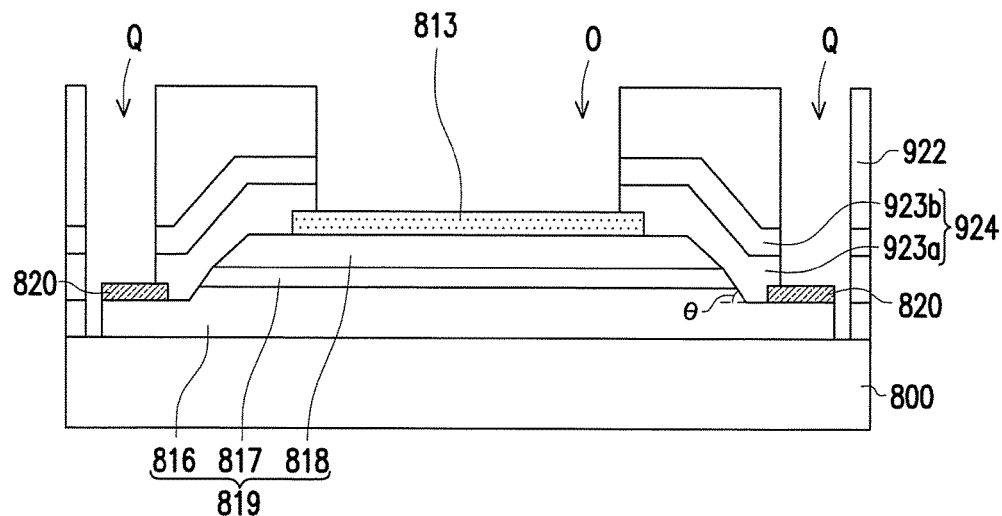
FIG. 9A to FIG. 9E are cross sections of the process of a manufacturing method of a display apparatus of another embodiment of the disclosure.

FIG. 9A to FIG. 9E are cross sections of the process of a manufacturing method of a display apparatus of another embodiment of the disclosure. FIG. 9A is a step performed after FIG. 8F. Moreover, the same or similar components in the embodiment of FIG. 9A to FIG. 9E and the embodiment of FIG. 8A to FIG. 8J can be implemented by the same material or method, and therefore the same descriptions as the embodiment of FIG. 8A to FIG. 8J are not repeated herein, and the differences between the two are mainly described.

Referring to FIG. 9A, a portion of the insulating material layer 821a, a portion of the insulating material layer 821b, and a portion of the first conductivity type semiconductor layer 816 are removed using a patterned organic layer 922 as a mask to form an insulating layer 923a, an insulating layer 923b, the opening O exposing the electrode 813, and an opening Q exposing the electrode 820 and the substrate 800. In the present embodiment, the forming method of the patterned organic layer 922 includes (but is not limited to) the following steps: first, an organic material layer (not shown) is conformally formed on the substrate 800; next, a patterned photoresist layer (not shown) is formed on the organic material layer, and then an etching process is performed using the patterned photoresist layer as a mask to remove the organic material layer not covered by the patterned photoresist layer; next, the patterned photoresist layer is removed. Moreover, in the present embodiment, the material of the patterned organic layer 922 is, for instance (but not limited to): an organic insulating material, an inorganic insulating material, or an insulating material formed by mixing organic insulating material and inorganic insulating material. In the present embodiment, the method of removing a portion of the insulating material layer 821a, a portion of the insulating material layer 821b, and a portion of the first conductivity type semiconductor layer 816 is, for instance (but not limited to): a dry etching method.

In the present embodiment, the insulating layer 923b is disposed on the insulating layer 923a, and the insulating layer 923a and the insulating layer 923b are disposed on the sidewall of the light-emitting diode body 819. Moreover, in the present embodiment, the insulating layer 923a and the insulating layer 923b form a reflective structure 924 reflecting light emitted from the light-emitting diode body 819. It should be mentioned that, as described above, since the light-emitting diode body 819 has an angle θ about 30 degrees to 85 degrees, the reflective structure 924 disposed on the sidewall of the light-emitting diode body 819 can control the light emitted by the light-emitting diode body 819 to be emitted out of the same side of the light-emitting diode body 819.

Figure 9B:
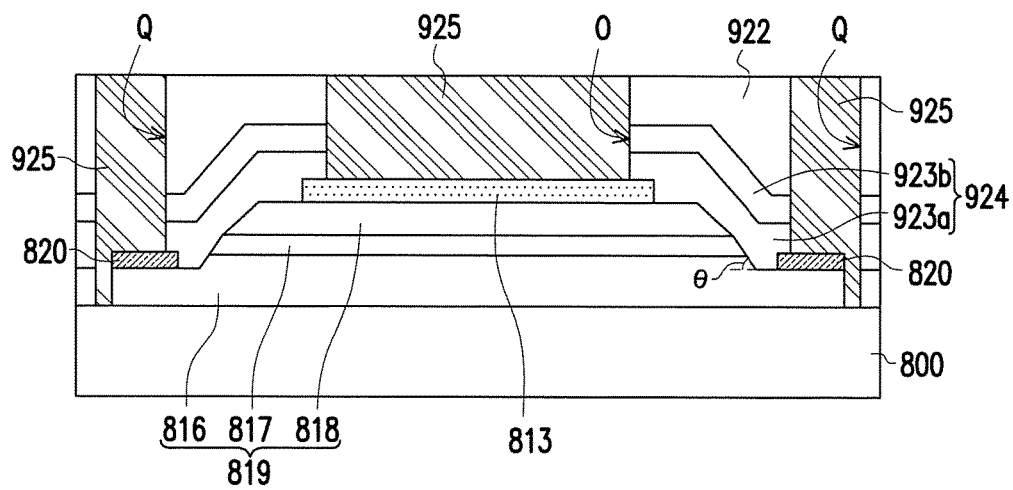

Next, referring to FIG. 9B, a bonding layer 925 is Ruined in the opening O and the opening Q. In the present embodiment, the material of the bonding layer 925 is, for instance (but not limited to): copper, tin, or an alloy material thereof. The forming method of the bonding layer 925 includes (but is not limited to) the following steps. First, a bonding material layer (not shown) filled in the opening O and the opening Q is formed on the substrate 900, and the forming method thereof is, for instance (but not limited to): an electrochemical plating method or vapor deposition. Next, the bonding material layer outside the opening O and the opening Q is removed to form the bonding layer 925 in the opening O and the opening Q, wherein the method of removing the bonding material layer outside the opening O and the opening Q is, for instance (but not limited to): a chemical mechanical polishing method, a chemical etching method, or a physical etching method.

Figure 9C:
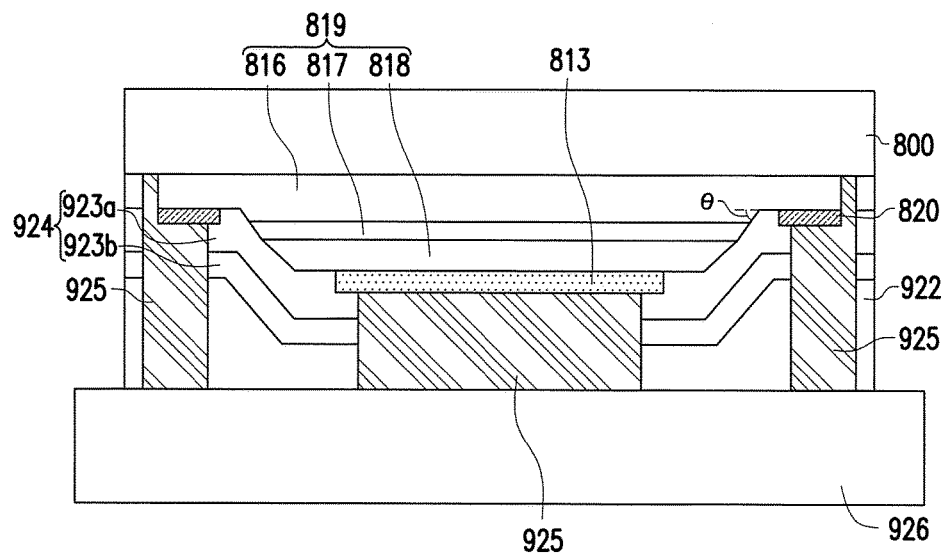

Next, referring to FIG. 9C, a carrier substrate 926 is provided. In the present embodiment, the material of the carrier substrate 926 is, for instance (but not limited to): glass, plastic, or substrate materials meeting requirements. Next, the carrier substrate 926 and the substrate 800 are bonded together to form the structure shown in FIG. 9C. Specifically, in the present embodiment, the bonding layer 925 and the carrier substrate 926 are in contact with each other, and the patterned organic layer 922 and the carrier substrate 926 are in contact with each other.

Figure 9D:
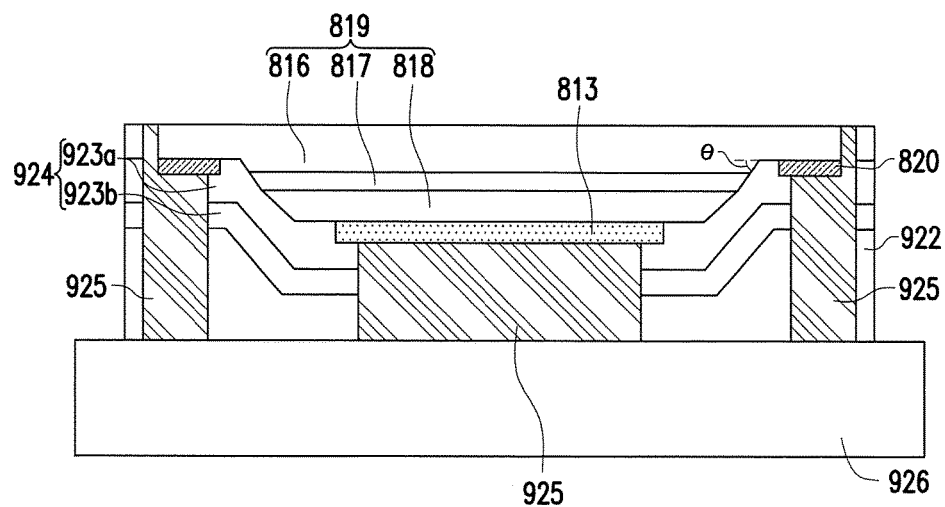

Next, referring to FIG. 9D, the substrate 800 is removed. Since relevant descriptions of the method of removing the substrate 800 are provided in detail in the embodiment of FIG. 8A to FIG. 8J, the method of removing the substrate 800 is not repeated herein. It should be mentioned that, in the present embodiment, a portion of the bonding layer 925 can be exposed by removing the substrate 800.

Figure 9E:
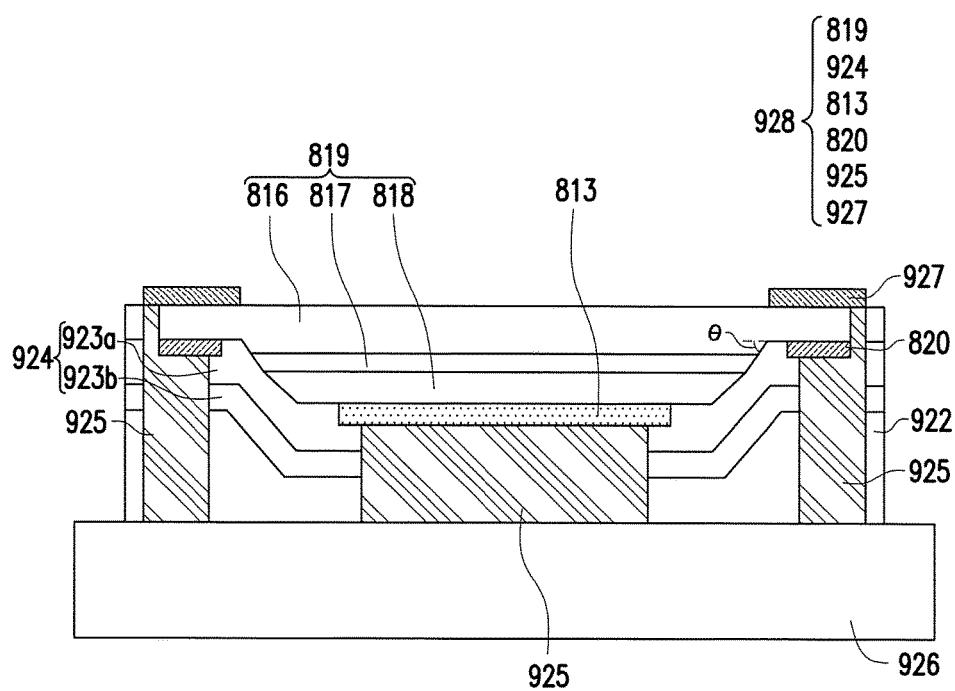

Next, referring to FIG. 9E, an electrode 927 is formed on the exposed bonding layer 925. Specifically, in the present embodiment, the electrode 927 and the electrode 820 are respectively disposed on two opposite sides of the first conductivity type semiconductor layer 816 and are connected to each other via the bonding layer 925. In the present embodiment, the material of the electrode 927 is, for instance (but not limited to): titanium, aluminum, or an alloy material thereof, and the method of forming the electrode 927 is, for instance (but not limited to): a lithography and etching process. It should be mentioned that, in the present embodiment, the electrode 927 and the electrode 820 are both, for instance, N-type electrodes, wherein the electrode 820 and the first conductivity type semiconductor layer 816 have good Ohmic contact and are used as Ohmic contact electrodes, and the electrode 927 is used as a connecting electrode connected to an external circuit.

At this point, the manufacture of the light-emitting diode 928 is almost completed. Specifically, in the present embodiment, the light-emitting diode 928 includes the light-emitting diode body 819, the reflective structure 924, the electrode 813, the electrode 820, the electrode 927, and the bonding layer 925, wherein the reflective structure 924 is disposed on the sidewall of the light-emitting diode body 819 and includes the insulating layer 923a and the insulating layer 923b stacked in order. As a result, a display apparatus including the light-emitting diode 928 can have good luminous efficiency. Moreover, in the present embodiment, the light-emitting diode 928 is a flip-chip type micro light-emitting diode.

It should be mentioned that, after the electrode 927 is formed, any person having ordinary skill in the art should understand that, the light-emitting diode 928 can be assembled in a display apparatus using any known process steps according to different applications.

Moreover, in the embodiment of FIG. 9A to FIG. 9E, the reflective structure 924 is a bilayer structure, i.e., includes the insulating layer 923a and the insulating layer 923b stacked in order, but the disclosure is not limited thereto. In other embodiments, the reflective layer 924 can also be a structure having three or more layers. For instance, in an embodiment, the reflective structure 924 can further include another insulating layer, and the refractive index of the other insulating layer can be different from the refractive index of the insulating layer 923a and the refractive index of the insulating layer 923b. As another example, in an embodiment, the reflective structure 924 can also include the insulating layer 923a and the insulating layer 923b alternately and repeatedly stacked.

Moreover, in the embodiments of FIG. 8A to FIG. 8J and FIG. 9A to FIG. 9E, the reflective structure is formed by two insulating layers (i.e., the reflective structure 824 in the embodiment of FIG. 8A to FIG. 8J is formed by the insulating layer 823a and the insulating layer 823b, and the reflective structure 924 in the embodiment of FIG. 9A to FIG. 9E is formed by the insulating layer 923a and the insulating layer 923b), but the disclosure is not limited thereto. In other embodiments, the reflective layer can also be formed by one insulating layer and one reflective metal layer. In other embodiments, the reflective layer can also be formed by one reflective metal layer. In the following, detailed description is provided with reference to FIG. 10A to FIG. 10E and FIG. 11A to FIG. 11G.

Figure 10A:
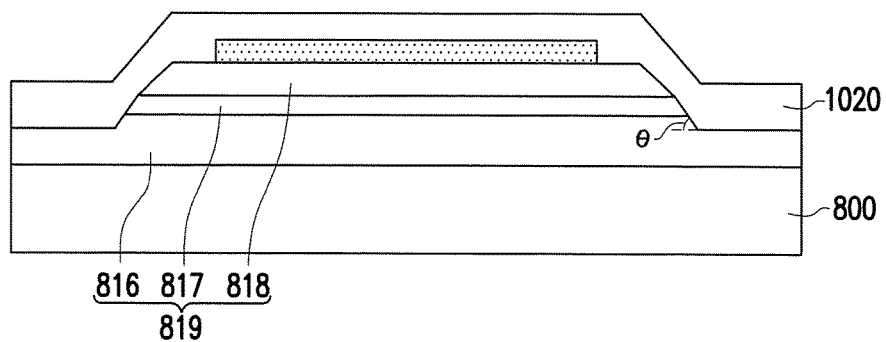
FIG. 10A to FIG. 10E are cross sections of the process of a manufacturing method of a display apparatus of another embodiment of the disclosure.

FIG. 10A to FIG. 10E are cross sections of the process of a manufacturing method of a display apparatus of another embodiment of the disclosure. FIG. 10A is a step performed after FIG. 8D. Moreover, the same or similar components in the embodiment of FIG. 10A to FIG. 10E and the embodiment of FIG. 8A to FIG. 8J can be implemented by the same material or method, and therefore the same descriptions as the embodiment of FIG. 8A to FIG. 8J are not repeated herein, and the differences between the two are mainly described.

Referring to FIG. 10A, first, an insulating material layer 1020 is formed on the substrate 800. Specifically, in the present embodiment, the insulating material layer 1020 is conformally formed on the substrate 800. In the present embodiment, the material of the insulating material layer 1020 is, for instance (but not limited to): silicon oxide or silicon nitride; the method of forming the insulating material layer 1020 is, for instance (but not limited to): a chemical vapor deposition method or a physical vapor deposition method.

Figure 10B:
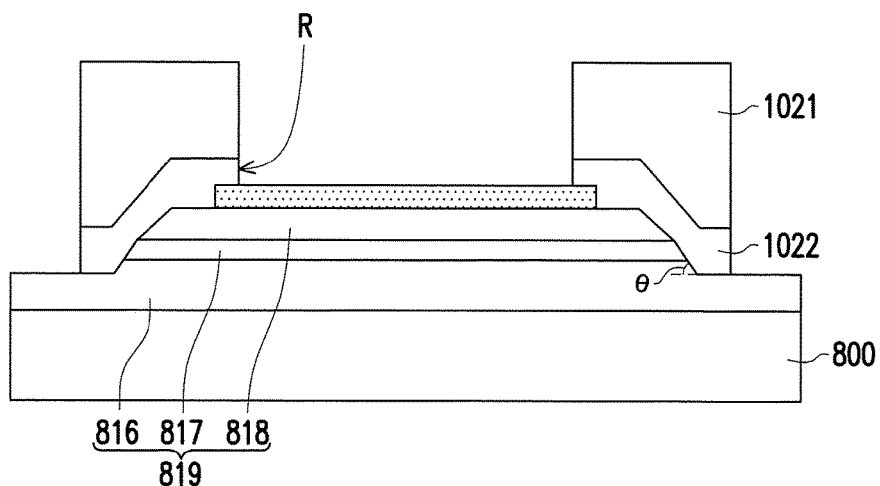

Next, referring to FIG. 10B, a portion of the insulating material layer 1020 is removed using the patterned photoresist layer 1021 as a mask to form an insulating layer 1022 and an opening R exposing the electrode 813. Specifically, in the present embodiment, the insulating layer 1022 is disposed on the sidewall of the light-emitting diode body 819. In the present embodiment, the method of forming the patterned photoresist layer 1021 is, for instance (but not limited to): a lithography process. In the present embodiment, the method of removing a portion of the insulating material layer 1020 is, for instance (but not limited to): a dry etching method.

Figure 10C:
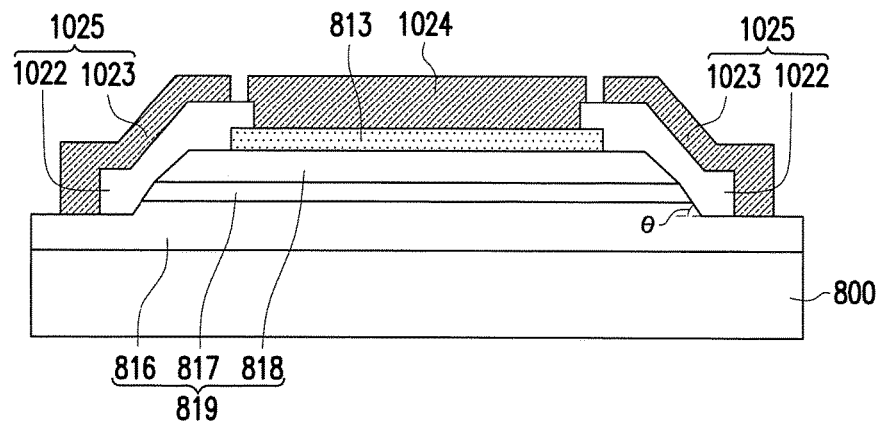

Then, referring to FIG. 10C, the patterned photoresist layer 1021 is removed. In the present embodiment, the method of removing the patterned photoresist layer 1021 is, for instance (but not limited to): a wet method using a stripper solution or a dry method using plasma ashing.

Next, an electrode 1023 and a conductive layer 1024 are formed, wherein the electrode 1023 covers the insulating layer 1022 and is in contact with the first conductivity type semiconductor layer 816, and the conductive layer 1024 is filled in the opening R and in contact with the electrode 813. Specifically, in the present embodiment, the electrode 1023 and the conductive layer 1024 may belong to the same film layer and have the same material. In other words, in the present embodiment, the electrode 1023 and the conductive layer 1024 are, for instance, formed together in the same lithography and etching process. In the present embodiment, the material of the electrode 1023 and the conductive layer 1024 is a metal material and is, for instance (but not limited to): aluminum, silver, or an alloy material thereof. In the present embodiment, the electrode 1023 is, for instance, an N-type electrode.

It should be mentioned that, in the present embodiment, the insulating layer 1022 and the electrode 1023 disposed on the insulating layer 1022 form a reflective structure 1025 reflecting light emitted from the light-emitting diode body 819. In other words, in the present embodiment, the electrode 1023 has the functions of signal transmission and light reflection at the same time, and therefore the electrode 1023 is also regarded as a reflective metal layer. Moreover, as described above, since the light-emitting diode body 819 has an angle θ about 30 degrees to 85 degrees, the reflective structure 1025 disposed on the sidewall of the light-emitting diode body 819 can control the light emitted by the light-emitting diode body 819 to be emitted out of the same side of the light-emitting diode body 819. Moreover, in the present embodiment, although the insulating layer 1022 and the electrode 1023 form the reflective structure 1025, the disclosure is not limited thereto. In other embodiments, the reflective layer 1025 can also only include the electrode 1023.

Figure 10D:
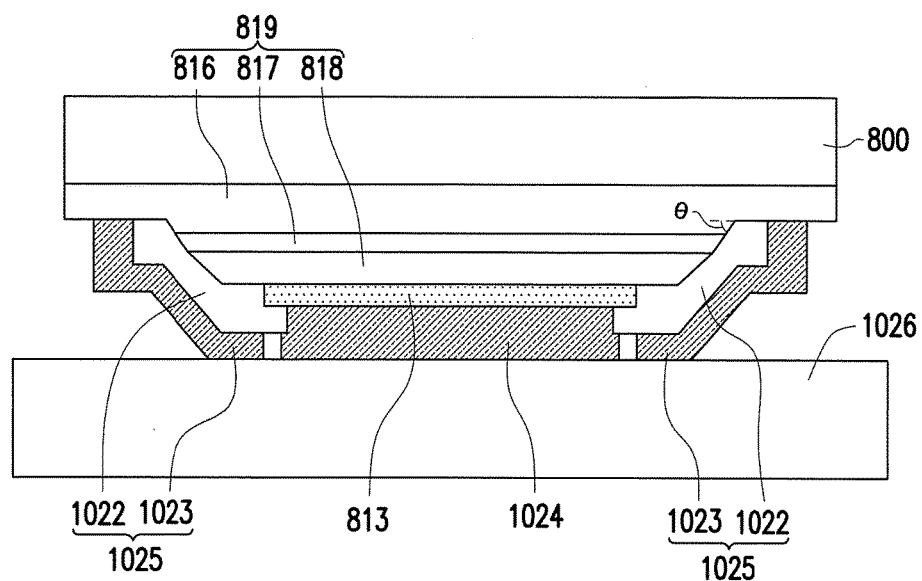

Next, referring to FIG. 10D, a carrier substrate 1026 is provided. In the present embodiment, the material of the carrier substrate 1026 is, for instance (but not limited to): glass, plastic, or other substrate materials meeting requirements. Next, the carrier substrate 1026 and the substrate 800 are bonded together to form the structure shown in FIG. 10E. Specifically, in the present embodiment, the electrode 1023 and the carrier substrate 1026 are in contact with each other, and the conductive layer 1024 and the carrier substrate 1026 are in contact with each other.

Figure 10E:
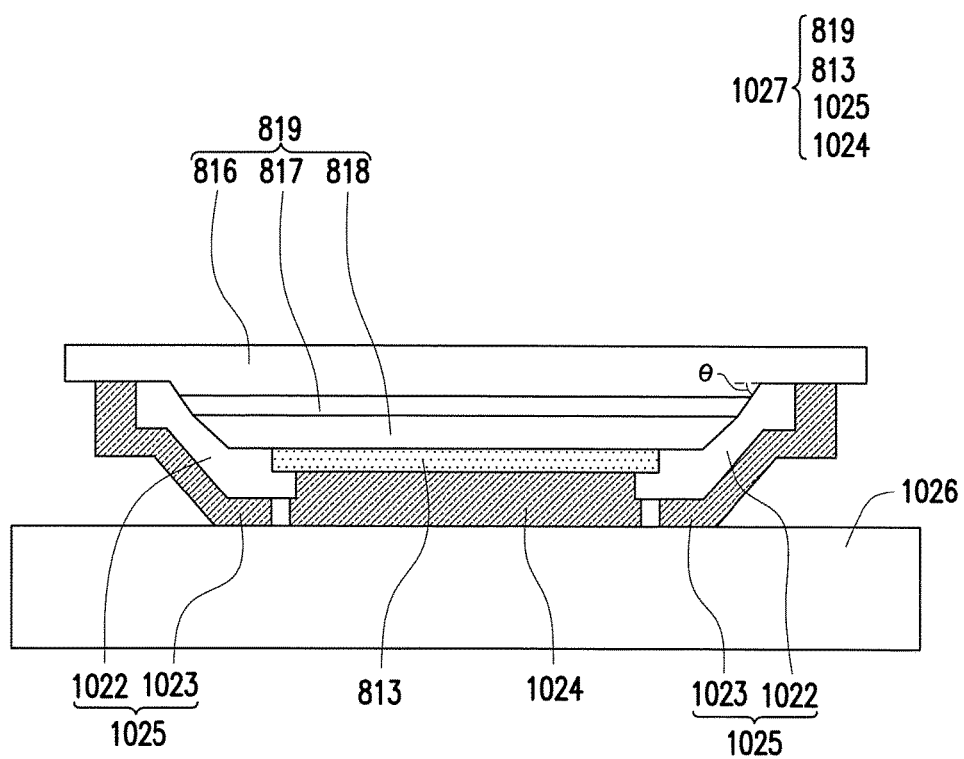

Next, referring to FIG. 10E, the substrate 800 is removed. Since relevant descriptions of the method of removing the substrate 800 are provided in detail in the embodiment of FIG. 8A to FIG. 8J, the method of removing the substrate 800 is not repeated herein. At this point, the manufacture of the light-emitting diode 1027 is almost completed. Specifically, in the present embodiment, the light-emitting diode 1027 includes the light-emitting diode body 819, the reflective structure 1025, the electrode 813, and the conductive layer 1024, wherein the reflective structure 1025 is disposed on the sidewall of the light-emitting diode body 819 and includes the insulating layer 1022 and the electrode 1023 stacked in order. As a result, a display apparatus including the light-emitting diode 1027 can have good luminous efficiency. Moreover, in the present embodiment, the light-emitting diode 1027 is a flip-chip type micro light-emitting diode.

It should be mentioned that, after the substrate 800 is removed, any person having ordinary skill in the art should understand that, the light-emitting diode 1027 can be assembled in a display apparatus using any known process steps according to different applications.

Moreover, in the embodiment of FIG. 10A to FIG. 10E, the reflective structure 1025 is a bilayer structure, i.e., includes the insulating layer 1022 and the electrode 1023 stacked in order, but the disclosure is not limited thereto. In other embodiments, the reflective layer 1025 can also be a structure having three or more layers. For instance, in an embodiment, the reflective structure 1025 can further include another insulating layer between the insulating layer 1022 and the electrode 1023, and the refractive index of the other insulating layer is different from the refractive index of the insulating layer 1022.

Figure 11A:
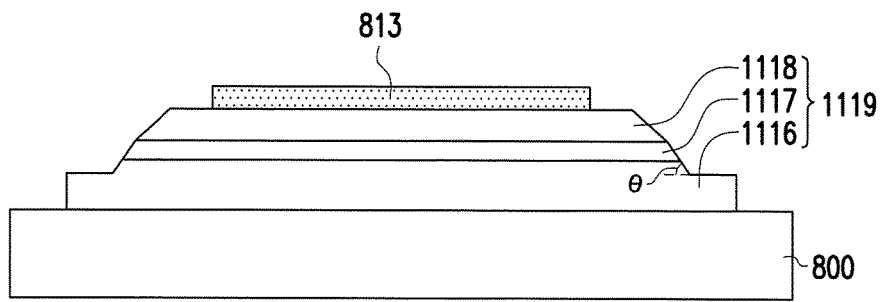
FIG. 11A to FIG. 11G are cross sections of the process of a manufacturing method of a display apparatus of another embodiment of the disclosure.

FIG. 11A to FIG. 11G are cross sections of the process of a manufacturing method of a display apparatus of another embodiment of the disclosure. FIG. 11A is a step performed after FIG. 8C. Moreover, the same or similar components in the embodiment of FIG. 11A to FIG. 11G and the embodiment of FIG. 8A to FIG. 8J can be implemented by the same material or method, and therefore the same descriptions as the embodiment of FIG. 8A to FIG. 8J are not repeated herein, and the differences between the two are mainly described.

Referring to FIG. 11A, first, a portion of the first conductivity type semiconductor material layer 810, a portion of the active material layer 811, and a portion of the second conductivity type semiconductor material layer 812 are removed using the reflowed patterned photoresist layer 815 as a mask to form a first conductivity type semiconductor layer 1116, an active layer 1117, and a second conductivity type semiconductor layer 1118. Specifically, in the present embodiment, the first conductivity type semiconductor layer 1116, the active layer 1117, and the second conductivity type semiconductor layer 1118 form a light-emitting diode body 1119, wherein the light-emitting diode body 1119 has an angle θ, and the angle θ is about 30 degrees to 85 degrees, preferably about 60 degrees. Moreover, in the present embodiment, the method of removing a portion of the first conductivity type semiconductor material layer 810, a portion of the active material layer 811, and a portion of the second conductivity type semiconductor material layer 812 is, for instance (but not limited to): a dry etching method. Moreover, in the present embodiment, the first conductivity type semiconductor layer 1116 is, for instance, an N-type semiconductor layer, and the second conductivity type semiconductor layer 1118 is, for instance, a P-type semiconductor layer.

Next, after the first conductivity type semiconductor layer 1116, the active layer 1117, and the second conductivity type semiconductor layer 1118 are formed, the reflowed patterned photoresist layer 815 is removed. In the present embodiment, the method of removing the reflowed patterned photoresist layer 815 is, for instance (but not limited to): a wet method using a stripper solution or a dry method using plasma ashing.

Figure 11B:
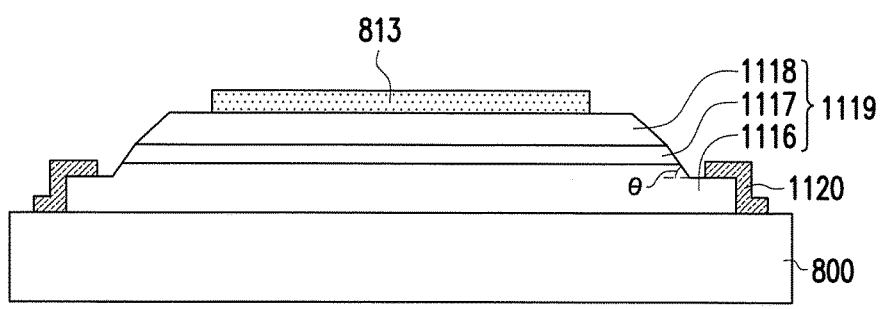

Next, referring to FIG. 11B, an electrode 1120 is formed on the substrate 800. Specifically, in the present embodiment, the electrode 1120 is in contact with the first conductivity type semiconductor layer 1116. Moreover, in the present embodiment, the electrode 1120 is in contact with the substrate 800. In the present embodiment, the material of the electrode 1120 is, for instance (but not limited to): titanium aluminum (Ti/Al) alloy, Ti, or Al, and the method of forming the electrode 1120 is, for instance (but not limited to): a lithography and etching process. Moreover, in the present embodiment, the electrode 1120 is, for instance, an N-type electrode.

Figure 11C:
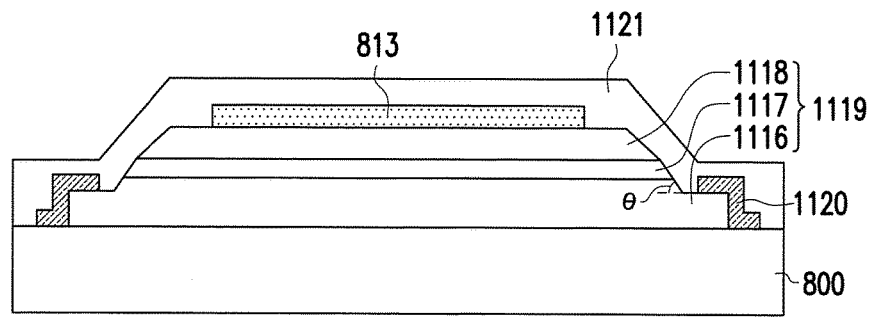

Referring to FIG. 11C, an insulating material layer 1121 is formed on the substrate 800. Specifically, in the present embodiment, the insulating material layer 1121 is conformally formed on the substrate 800. In the present embodiment, the material of the insulating material layer 1121 is, for instance (but not limited to): silicon oxide or silicon nitride; the method of forming the insulating material layer 1121 is, for instance (but not limited to): a chemical vapor deposition method or a physical vapor deposition method.

Figure 11D:
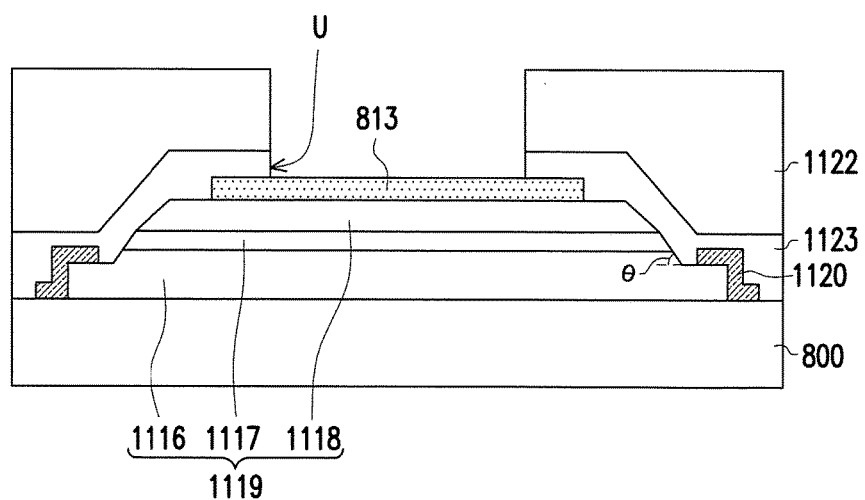

Next, referring to FIG. 11D, a portion of the insulating material layer 1121 is removed using the patterned photoresist layer 1122 as a mask to form an insulating layer 1123 and an opening U exposing the electrode 813. Specifically, in the present embodiment, the insulating layer 1123 is disposed on the sidewall of the light-emitting diode body 1119. In the present embodiment, the method of forming the patterned photoresist layer 1122 is, for instance (but not limited to): a lithography process. In the present embodiment, the method of removing a portion of the insulating material layer 1121 is, for instance (but not limited to): a dry etching method.

Figure 11E:
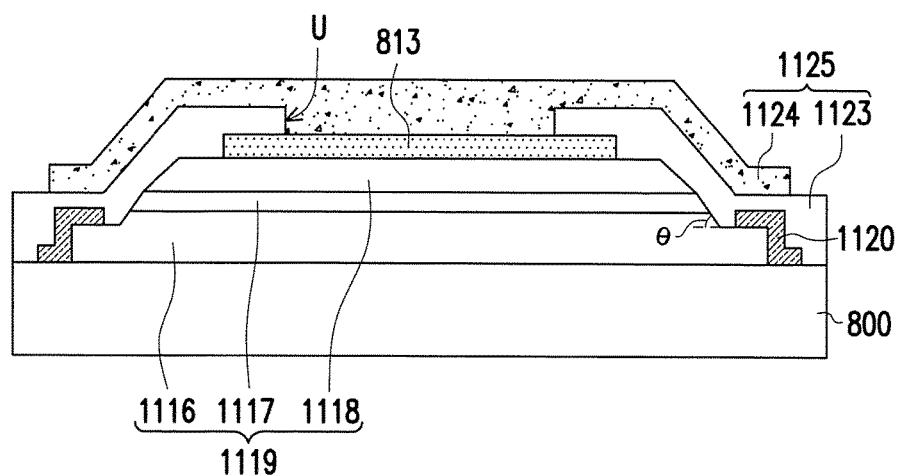

Then, referring to FIG. 11E, the patterned photoresist layer 1122 is removed. In the present embodiment, the method of removing the patterned photoresist layer 1122 is, for instance (but not limited to): a wet method using a stripper solution or a dry method using plasma ashing.

Next, a conductive layer 1124 is formed, wherein the conductive layer 1124 covers the insulating layer 1123 and is filled in the opening U to be in contact with the electrode 813. In the present embodiment, the material of the conductive layer 1124 is a metal material and is, for instance (but not limited to): aluminum, silver, or an alloy material thereof. In the present embodiment, the method of forming the conductive layer 1124 is, for instance (but not limited to): a lithography and etching process.

It should be mentioned that, in the present embodiment, the electrode 813 and the conductive layer 1124 are both, for instance, P-type electrodes, wherein the electrode 813 and the second conductivity type semiconductor layer 1118 have good Ohmic contact and are used as Ohmic contact electrodes, and the conductive layer 1124 is used as a connecting electrode connected to an external circuit. Moreover, in the present embodiment, the insulating layer 1123 and the conductive layer 1124 disposed on the insulating layer 1123 form a reflective structure 1125 reflecting light emitted from the light-emitting diode body 1119. In other words, in the present embodiment, the conductive layer 1124 has the functions of signal transmission and light reflection at the same time, and therefore the conductive layer 1124 can also be regarded as a reflective metal layer. Moreover, as described above, since the light-emitting diode body 1119 has an angle θ about 30 degrees to 85 degrees, the reflective structure 1125 disposed on the sidewall of the light-emitting diode body 1119 can control the light emitted by the light-emitting diode body 1119 to be emitted out of the same side of the light-emitting diode body 1119.

Figure 11F:
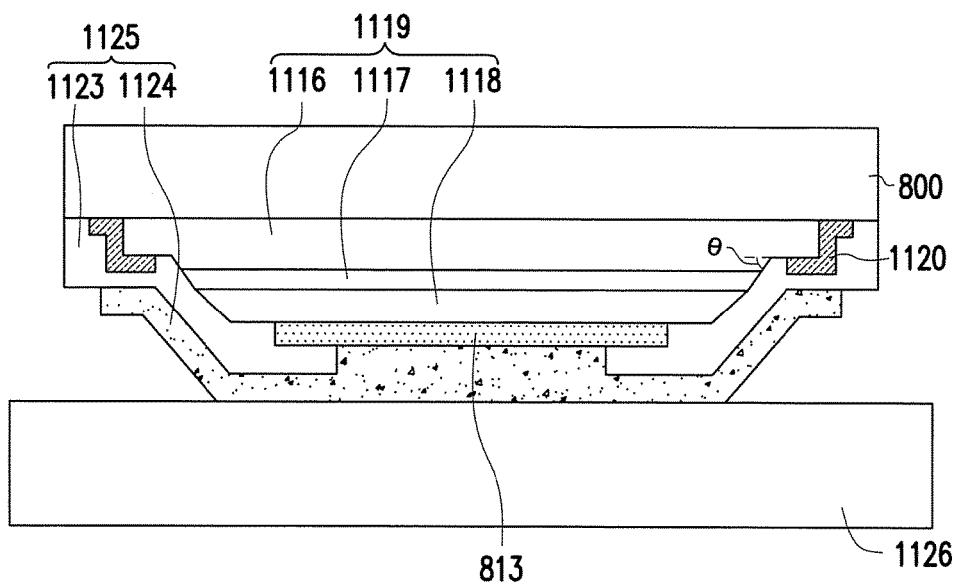

Next, referring to FIG. 11F, a carrier substrate 1126 is provided. In the present embodiment, the material of the carrier substrate 1126 is, for instance (but not limited to): glass, plastic, or substrate materials meeting requirements. Next, the carrier substrate 1126 and the substrate 800 are bonded together to form the structure shown in FIG. 11F. Specifically, in the present embodiment, the conductive layer 1124 and the carrier substrate 1126 are in contact with each other.

Figure 11G:
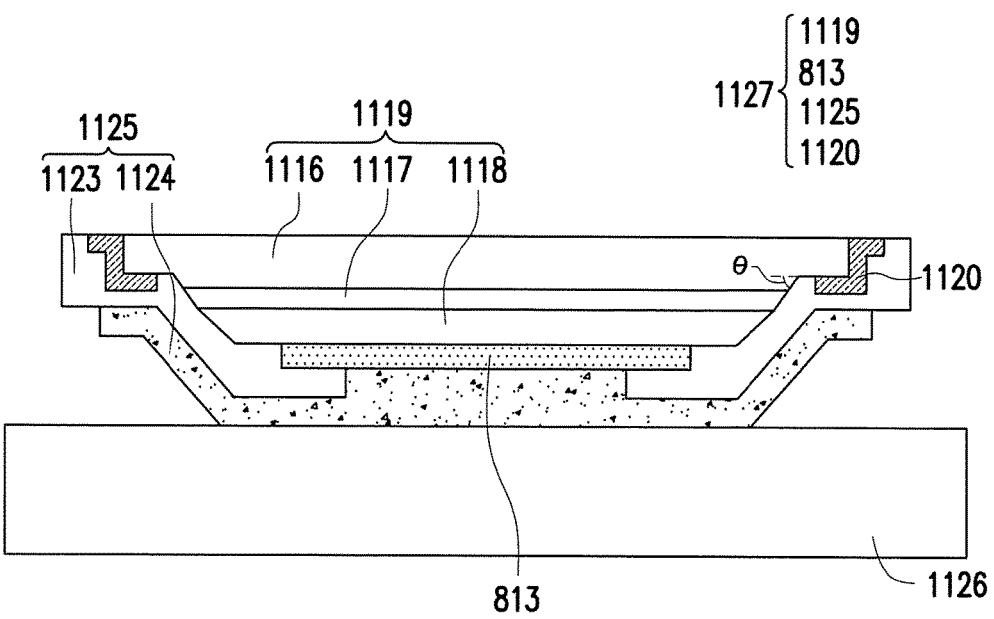

Next, referring to FIG. 11G, the substrate 800 is removed. Since relevant descriptions of the method of removing the substrate 800 are provided in detail in the embodiment of FIG. 8A to FIG. 8J, the method of removing the substrate 800 is not repeated herein. At this point, the manufacture of the light-emitting diode 1127 is almost completed. Specifically, in the present embodiment, the light-emitting diode 1127 includes the light-emitting diode body 1119, the reflective structure 1125, the electrode 813, and the electrode 1120, wherein the reflective structure 1125 is disposed on the sidewall of the light-emitting diode body 1119 and includes the insulating layer 1123 and the conductive layer 1124 stacked in order. As a result, a display apparatus including the light-emitting diode 1127 can have good luminous efficiency. Moreover, in the present embodiment, the light-emitting diode 1127 is a flip-chip type micro light-emitting diode.

It should be mentioned that, after the substrate 800 is removed, any person having ordinary skill in the art should understand that, the light-emitting diode 1127 can be assembled in a display apparatus using any known process steps according to different applications.

Moreover, in the embodiment of FIG. 11A to FIG. 11G, the reflective structure 1125 is a bilayer structure, i.e., includes the insulating layer 1123 and the conductive layer 1124 stacked in order, but the disclosure is not limited thereto. In other embodiments, the reflective layer 1125 can also be a structure having three or more layers. For instance, in an embodiment, the reflective structure 1125 can further include another insulating layer between the insulating layer 1123 and the conductive layer 1124, and the refractive index of the other insulating layer is different from the refractive index of the insulating layer 1123.

Based on the above, in the display apparatus of the disclosure, the ratio of the distance between two surfaces of the light-emitting diode disposed opposite to each other and parallel to the substrate to the distance between the upper surface of the metal layer electrically connected to the transistor and the light-emitting diode and the substrate in the direction perpendicular to the substrate is greater than or equal to 0.25 and less than or equal to 6, and therefore the display apparatus can have good luminous efficiency or good structural strength. Moreover, the display apparatus obtained from the manufacturing method of the display apparatus of the disclosure includes a reflective structure disposed on the sidewall of the light-emitting diode body, such that the display apparatus can have good luminous efficiency.

Although the disclosure has been described with reference to the above embodiments, it will be apparent to one of the ordinary skill in the art that modifications and variations to the described embodiments may be made without departing from the spirit and scope of the disclosure. Accordingly, the scope of the disclosure will be defined by the attached claims not by the above detailed descriptions.

What is claimed is:
1. A display apparatus, comprising:
a substrate;
a transistor disposed on the substrate;
a metal layer disposed on the transistor and electrically connected to the transistor, wherein a first distance is between an upper surface of the metal layer and the substrate in a direction perpendicular to the substrate; and a light-emitting diode disposed on the metal layer, wherein the light-emitting diode comprises a light-emitting diode body and an electrode, the light-emitting diode body is electrically connected to the metal layer via the electrode, the light-emitting diode body has a first surface and a second surface opposite to the first surface, the first surface and the second surface are parallel to the substrate, and in the direction, a second distance is between the first surface and the second surface, wherein a ratio of the second distance to the first distance is greater than or equal to 0.25 and less than or equal to 6.

2. The display apparatus of claim 1, wherein the ratio of the second distance to the first distance is greater than or equal to 0.6 and less than or equal to 5.

3. The display apparatus of claim 1, wherein the light-emitting diode further comprises a buffer layer disposed on the light-emitting diode body, wherein a top surface of the buffer layer has a plurality of grooves.

4. The display apparatus of claim 1, wherein the light-emitting diode body comprises:
   a first conductivity type semiconductor layer;
   an active layer disposed on the first conductivity type semiconductor layer; and
   a second conductivity type semiconductor layer disposed on the active layer.

5. The display apparatus of claim 4, wherein the second conductivity type semiconductor layer has the second surface, and the second surface has a plurality of grooves.

6. The display apparatus of claim 1, wherein the light-emitting diode further comprises a reflective structure disposed on a sidewall of the light-emitting diode body.

7. The display apparatus of claim 6, wherein the reflective structure a refractive index comprises:
   a first insulating layer; and
   a second insulating layer disposed on the first insulating layer, wherein of the first insulating layer is different from a refractive index of the second insulating layer.

8. The display apparatus of claim 6, wherein the reflective structure comprises a reflective metal layer.

* * * * *